(12) United States Patent
Chen et al.

(10) Patent No.: US 9,406,522 B2
(45) Date of Patent: Aug. 2, 2016

(54) SINGLE PLATFORM, MULTIPLE CYCLE SPACER DEPOSITION AND ETCH

(71) Applicant: Applied Materials, Inc., Santa Clara, CA (US)

(72) Inventors: Hao Chen, Santa Clara, CA (US); Chentsau (Chris) Ying, Cupertino, CA (US); Srinivas D. Nemani, Sunnyvale, CA (US); Ellie Y. Yieh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/495,794

(22) Filed: Sep. 24, 2014

(65) Prior Publication Data

US 2016/0027655 A1    Jan. 28, 2016

Related U.S. Application Data

(60) Provisional application No. 62/028,773, filed on Jul. 24, 2014.

(51) Int. Cl.
*H01L 21/308* (2006.01)
*C23C 16/34* (2006.01)
(Continued)

(52) U.S. Cl.
CPC ............ *H01L 21/3086* (2013.01); *C23C 16/34* (2013.01); *C23C 16/45544* (2013.01); *C23C 16/50* (2013.01); *H01J 37/32009* (2013.01); *H01J 37/32082* (2013.01); *H01L 21/0228* (2013.01); *H01L 21/02274* (2013.01); *H01L 21/3065* (2013.01); *H01L 21/30604* (2013.01); *H01L 21/31116* (2013.01); *H01L 21/67069* (2013.01); *H01L 21/67207* (2013.01); *H01L 21/67742* (2013.01)

(58) Field of Classification Search
CPC ....... H01L 21/20; H01L 21/76; H01L 21/311; H01L 21/336; H01L 21/3205; H01L 21/8238; H01L 21/8249; H01L 29/04; H01L 29/76; H01L 29/94
See application file for complete search history.

(56) References Cited

U.S. PATENT DOCUMENTS 6,191,449 B1    2/2001    Shino
6,277,700 B1    8/2001    Yu et al.
(Continued)

FOREIGN PATENT DOCUMENTS

EP         2165355 B1       10/2013
KR     10-2011-0087976 A     8/2011
(Continued)

OTHER PUBLICATIONS

International Search Report and Written Opinion for International Appln. No. PCT/US2015/035666, date of mailing Oct. 16, 2015, 10 pgs.

*Primary Examiner* — Kyoung Lee
(74) *Attorney, Agent, or Firm* — Blakely, Sokoloff, Taylor & Zafman LLP

(57) ABSTRACT

A first portion of a multiple cycle spacer is formed on a sidewall of a patterned feature over a substrate. A spacer layer is deposited on the first portion using a first plasma process. The spacer layer is etched to form a second portion of the multiple cycle spacer on the first portion using a second plasma process. A cycle comprising depositing and etching of the spacer layer is continuously repeated until the multiple cycle spacer is formed.

19 Claims, 10 Drawing Sheets

(51) Int. Cl.
*C23C 16/455* (2006.01)
*C23C 16/50* (2006.01)
*H01J 37/32* (2006.01)
*H01L 21/02* (2006.01)
*H01L 21/306* (2006.01)
*H01L 21/3065* (2006.01)
*H01L 21/311* (2006.01)
*H01L 21/67* (2006.01)
*H01L 21/677* (2006.01)

(56) References Cited

U.S. PATENT DOCUMENTS

| | | | |
|---|---|---|---|
| 6,559,017 B1 | 5/2003 | Brown et al. | |
| 6,872,647 B1* | 3/2005 | Yu | B82Y 10/00 |
| | | | 257/E21.038 |
| 7,629,245 B2 | 12/2009 | Park | |
| 7,923,373 B2 | 4/2011 | Sandhu | |
| 7,989,307 B2 | 8/2011 | Parekh et al. | |
| 8,187,932 B2 | 5/2012 | Nguyen et al. | |
| 8,212,976 B2 | 7/2012 | Park | |
| 8,288,752 B2 | 10/2012 | Park | |
| 8,542,519 B2 | 9/2013 | Asao et al. | |
| 8,685,825 B2 | 4/2014 | Tang et al. | |
| 8,698,223 B2 | 4/2014 | Jung | |
| 8,755,019 B2 | 6/2014 | Park et al. | |
| 2005/0127349 A1* | 6/2005 | Horak | H01L 45/06 |
| | | | 257/3 |
| 2008/0081418 A1 | 4/2008 | Park | |
| 2009/0004867 A1 | 1/2009 | Yune | |
| 2009/0124085 A1 | 5/2009 | Tsai et al. | |
| 2009/0186485 A1 | 7/2009 | Lam et al. | |
| 2009/0267237 A1 | 10/2009 | Choi | |
| 2010/0167548 A1 | 7/2010 | Kim | |
| 2011/0033786 A1 | 2/2011 | Sandhu | |
| 2011/0215382 A1 | 9/2011 | Asao et al. | |
| 2012/0100706 A1 | 4/2012 | Sim et al. | |
| 2013/0084688 A1 | 4/2013 | O'Meara et al. | |
| 2013/0187207 A1 | 7/2013 | Tang et al. | |
| 2014/0097499 A1 | 4/2014 | Parekh et al. | |
| 2014/0175568 A1 | 6/2014 | Tang et al. | |

FOREIGN PATENT DOCUMENTS

| | | |
|---|---|---|
| WO | WO 2008150673 A1 | 12/2008 |
| WO | WO 2012051159 A1 | 4/2012 |
| WO | WO 2016/014168 A1 | 1/2016 |

* cited by examiner

Single-Cycle Spacer Dep/Etch   Multiple-Cycle Spacer Dep/Etch

SINGLE PLATFORM, MULTIPLE CYCLE SPACER DEPOSITION AND ETCH

This application claims the benefit of prior U.S. Provisional Patent Application No. 62/028,773, entitled "SINGLE PLATFORM, MULTIPLE CYCLE SPACER DEPOSITION AND ETCH" filed on Jul. 24, 2014, which is hereby incorporated by reference in its entirety.

FIELD

Embodiments of the present invention pertain to the field of electronic device manufacturing, and in particular, to spacer formation.

BACKGROUND

As geometries of the electronic devices shrink, lithography and patterning for electronic device designs become more challenging. Typically, a deep ultraviolet (DUV) immersion lithography is used to enhance the photolithography resolution to manufacture integrated circuits (ICs). Typically, DUV lithography uses laser light with wavelengths of 248 and 193 nm. Generally, the immersion lithography is a technique that replaces the usual air gap between the final lens and the wafer surface with a liquid medium that has a refractive index greater than one.

Generally, multiple patterning refers to a class of technologies for manufacturing integrated circuits (ICs), developed for photolithography to enhance the feature density. An example of multiple patterning is double patterning, where a conventional lithography process is enhanced to double the existing number of features. Typically, a spacer is used in the double patterning technique. The spacer refers to a film formed on the sidewall of a pre-patterned feature. By removing the original pre-patterned feature, only the spacer is left. Because there are two spacers for every line, the line density has now doubled.

Typically, existing multiple patterning techniques generate spacers having the profiles that have a shoulder recess (faceting), a tapered bottom (footing), and width non-uniformity due to pattern loading effect. The faceting, footing, and width non-uniformity cause difficulties in maintaining the spacer profile to transfer the pattern to underlying layers. Additionally, the faceting and footing of the spacer profile and the pattern loading effect causes difficulties in controlling critical dimension (CD) and critical dimension uniformity (CDU) of the patterned features. This causes significant design rule limitation on patterns which can be printed, and leads to high manufacturing cost.

SUMMARY

Methods and apparatuses to provide a single-platform multiple cycle spacer deposition and etch technique are described. In one embodiment, a first portion of a multiple cycle spacer is formed on a sidewall of a patterned feature over a substrate. A spacer layer is deposited on the first portion using a first plasma process. The spacer layer is etched to form a second portion of the multiple cycle spacer on the first portion using a second plasma process. A cycle comprising depositing of the spacer layer and subsequently etching of the spacer layer is continuously repeated until the multiple cycle spacer is formed.

In one embodiment, a first portion of a multiple cycle spacer is formed on a sidewall of a patterned feature over a substrate. A spacer layer is deposited on the first portion using a first plasma process. The spacer layer is etched to form a second portion of the multiple cycle spacer on the first portion using a second plasma process. A cycle comprising depositing and etching of the spacer layer is continuously repeated until the multiple cycle spacer having a predetermined thickness is formed. The patterned feature comprises a hard mask, a gate stack, or both. The spacer layer is a nitride layer.

In one embodiment, a first portion of a multiple cycle spacer is formed on a sidewall of a patterned feature over a substrate. A spacer layer is deposited on the first portion using a first plasma process. The spacer layer is etched to form a second portion of the multiple cycle spacer on the first portion using a second plasma process. A cycle comprising depositing and etching of the spacer layer is continuously repeated until the multiple cycle spacer having a predetermined thickness is formed. The depositing and etching operations are performed using a single plasma chamber.

In one embodiment, a first portion of a multiple cycle spacer is formed on a sidewall of a patterned feature over a substrate. A spacer layer is deposited on the first portion using a first plasma process. The spacer layer is etched to form a second portion of the multiple cycle spacer on the first portion using a second plasma process. A cycle comprising depositing and etching of the spacer layer is continuously repeated until the multiple cycle spacer having a predetermined thickness is formed. The depositing and etching operations are performed using a single vacuum system in a single or multiple plasma chambers.

In one embodiment, a first portion of a multiple cycle spacer is formed on a sidewall of a patterned feature over a substrate. A spacer layer is deposited on the first portion using a first plasma process. The spacer layer is etched to form a second portion of the multiple cycle spacer on the first portion using a second plasma process. A cycle comprising depositing and etching of the spacer layer is continuously repeated until the multiple cycle spacer having a predetermined thickness is formed. Next, the patterned feature is removed from the multiple cycle spacer on a device layer on the substrate. The device layer is etched using the multiple cycle spacer as a mask, and then the multiple cycle spacer is removed.

In one embodiment, a first portion of a multiple cycle spacer is formed on a sidewall of a patterned feature over a substrate. A spacer layer is deposited on the first portion using a first plasma process. The spacer layer is etched to form a second portion of the multiple cycle spacer on the first portion using a second plasma process. A cycle comprising depositing and etching of the spacer layer is continuously repeated until the multiple cycle spacer having a predetermined thickness is formed. The thickness of the spacer layer is from about 5 nanometers (nm) to about 10 nm.

In one embodiment, a first portion of a multiple cycle spacer is formed on a sidewall of a patterned feature over a substrate. A spacer layer is deposited on the first portion using a first plasma process. The spacer layer is etched to form a second portion of the multiple cycle spacer on the first portion using a second plasma process. A cycle comprising depositing and etching of the spacer layer is continuously repeated until the multiple cycle spacer having a predetermined thickness is formed. The depositing operation is performed using a sub-atmospheric chemical vapor deposition (SACVD) technique, a low pressure chemical vapor deposition (LPCVD) technique, a plasma enhanced chemical vapor deposition (PECVD) technique, a high density plasma chemical vapor deposition (HDP-CVD) technique, or an atomic layer deposition (ALD) technique.

In one embodiment, a first spacer layer is deposited on a first patterned feature over a substrate using a first plasma process. The first spacer layer is etched to form a first portion of a first multiple cycle spacer on a sidewall of the patterned feature using a second plasma process. A second spacer layer is deposited on the first portion using the first plasma process. The second spacer layer is etched using the second plasma process to form a second portion of the first multiple cycle spacer on the first portion.

In one embodiment, a first spacer layer is deposited on a first patterned feature over a substrate using a first plasma process. The first spacer layer is etched to form a first portion of a first multiple cycle spacer on a sidewall of the patterned feature using a second plasma process. A second spacer layer is deposited on the first portion using the first plasma process. The second spacer layer is etched using the second plasma process to form a second portion of the first multiple cycle spacer on the first portion. The first patterned feature is removed from the first multiple cycle spacer. A third spacer layer is deposited on the first multiple cycle spacer using the first plasma process. The third spacer layer is etched using the second plasma process to form a first portion of a second multiple cycle spacer. A cycle comprising depositing and etching of the third spacer layer is continuously repeated until the second multiple cycle spacer having a predetermined thickness is formed.

In one embodiment, a first spacer layer is deposited on a first patterned feature over a substrate using a first plasma process. The first spacer layer is etched to form a first portion of a first multiple cycle spacer on a sidewall of the patterned feature using a second plasma process. A second spacer layer is deposited on the first portion using the first plasma process. The second spacer layer is etched using the second plasma process to form a second portion of the first multiple cycle spacer on the first portion. The first patterned feature comprises a hard mask, a gate stack, or both. Each of the first spacer layer and the second spacer layer is a nitride layer.

In one embodiment, a first spacer layer is deposited on a first patterned feature over a substrate using a first plasma process. The first spacer layer is etched to form a first portion of a first multiple cycle spacer on a sidewall of the patterned feature using a second plasma process. A second spacer layer is deposited on the first portion using the first plasma process. The second spacer layer is etched using the second plasma process to form a second portion of the first multiple cycle spacer on the first portion. The thickness of each of the first spacer layer and second spacer layer is from about 5 nm to about 10 nm.

In one embodiment, a first spacer layer is deposited on a first patterned feature over a substrate using a first plasma process. The first spacer layer is etched to form a first portion of a first multiple cycle spacer on a sidewall of the patterned feature using a second plasma process. A second spacer layer is deposited on the first portion using the first plasma process. The second spacer layer is etched using the second plasma process to form a second portion of the first multiple cycle spacer on the first portion. The depositing and etching operations are performed in a single vacuum system.

In one embodiment, a first spacer layer is deposited on a first patterned feature over a substrate using a first plasma process. The first spacer layer is etched to form a first portion of a first multiple cycle spacer on a sidewall of the patterned feature using a second plasma process. A second spacer layer is deposited on the first portion using the first plasma process. The second spacer layer is etched using the second plasma process to form a second portion of the first multiple cycle spacer on the first portion. The depositing and etching operations are performed in a single plasma chamber.

In one embodiment, a first spacer layer is deposited on a first patterned feature over a substrate using a first plasma process. The first spacer layer is etched to form a first portion of a first multiple cycle spacer on a sidewall of the patterned feature using a second plasma process. A second spacer layer is deposited on the first portion using the first plasma process. The second spacer layer is etched using the second plasma process to form a second portion of the first multiple cycle spacer on the first portion. Each of the depositing and etching involves adjusting at least one of a pressure, a temperature, a time, bias power, source power, a first gas chemistry, a first gas flow, or any combination thereof.

In one embodiment, a system to manufacture an electronic device comprises a processing chamber. The processing chamber comprises a pedestal to hold a workpiece comprising a first patterned feature over a substrate. A plasma source is coupled to the processing chamber to generate first plasma particles at a first plasma process. A processor is coupled to the plasma source. The processor has a configuration to control forming of a first portion of a first multiple cycle spacer on a sidewall of the first patterned feature. The processor has a configuration to control depositing a first spacer layer on the first portion using the first plasma process. The processor has a configuration to control etching of the first spacer layer to form a second portion of the first multiple cycle spacer on the first portion using second plasma particles at a second plasma process. The processor has a configuration to continuously repeat a cycle comprising the depositing and etching operations until the first multiple cycle spacer having a predetermined thickness is formed.

In one embodiment, a system to manufacture an electronic device comprises a processing chamber. The processing chamber comprises a pedestal to hold a workpiece comprising a first patterned feature over a substrate. A plasma source is coupled to the processing chamber to generate first plasma particles at a first plasma process. The plasma source is coupled to the processing chamber to generate second plasma particles at a second plasma process. A processor is coupled to the plasma source. The processor has a configuration to control forming of a first portion of a first multiple cycle spacer on a sidewall of the first patterned feature. The processor has a configuration to control depositing a first spacer layer on the first portion using the first plasma process. The processor has a configuration to control etching of the first spacer layer to form a second portion of the first multiple cycle spacer on the first portion using second plasma process. The processor has a configuration to continuously repeat a cycle comprising the depositing and etching operations until the first multiple cycle spacer having a predetermined thickness is formed.

In one embodiment, a system to manufacture an electronic device comprises a first processing chamber, a second processing chamber coupled to the first processing chamber and a vacuum system coupled to the first processing chamber and the second processing chamber. Each of the processing chambers comprises a pedestal to hold a workpiece comprising a first patterned feature over a substrate. A plasma source is coupled to the first processing chamber to generate first plasma particles at a first plasma process. A processor is coupled to the plasma source. The processor has a configuration to control forming of a first portion of a first multiple cycle spacer on a sidewall of the first patterned feature. The processor has a configuration to control depositing a first spacer layer on the first portion using the first plasma process. The processor has a configuration to control etching of the first spacer layer to form a second portion of the first multiple cycle spacer on the first portion using second plasma particles at a second plasma process. The processor has a configuration to continuously repeat a cycle comprising the depositing and etching operations until the first multiple cycle spacer having a predetermined thickness is formed.

In one embodiment, a system to manufacture an electronic device comprises a processing chamber. The processing chamber comprises a pedestal to hold a workpiece comprising a first patterned feature over a substrate. A plasma source is coupled to the processing chamber to generate first plasma particles at a first plasma process. A processor is coupled to the plasma source. The processor has a configuration to control forming of a first portion of a first multiple cycle spacer on a sidewall of the first patterned feature. The processor has a configuration to control depositing a first spacer layer on the first portion using the first plasma process. The processor has a configuration to control etching of the first spacer layer to form a second portion of the first multiple cycle spacer on the first portion using second plasma particles at a second plasma process. The processor has a configuration to continuously repeat a cycle comprising the depositing and etching operations until the first multiple cycle spacer having a predetermined thickness is formed. The processor has a configuration to control removing the first patterned feature from the first multiple cycle spacer on a device layer on the substrate. The processor has a configuration to control etching of the device layer using the first multiple cycle spacer as a mask. The processor has a configuration to control removing the first multiple cycle spacer.

In one embodiment, a system to manufacture an electronic device comprises a processing chamber. The processing chamber comprises a pedestal to hold a workpiece comprising a first patterned feature over a substrate. A plasma source is coupled to the processing chamber to generate first plasma particles at a first plasma process. A processor is coupled to the plasma source. The processor has a configuration to control forming of a first portion of a first multiple cycle spacer on a sidewall of the first patterned feature. The processor has a configuration to control depositing a first spacer layer on the first portion using the first plasma process. The processor has a third configuration to control etching of the first spacer layer to form a second portion of the first multiple cycle spacer on the first portion using second plasma particles at a second plasma process. The processor has a configuration to continuously repeat a cycle comprising the depositing and etching operations until the first multiple cycle spacer having a predetermined thickness is formed. The thickness of the first spacer layer is from about 5 nm to about 10 nm.

In one embodiment, a system to manufacture an electronic device comprises a processing chamber. The processing chamber comprises a pedestal to hold a workpiece comprising a first patterned feature over a substrate. A plasma source is coupled to the processing chamber to generate first plasma particles at a first plasma process. A processor is coupled to the plasma source. The processor has a configuration to control forming of a first portion of a first multiple cycle spacer on a sidewall of the first patterned feature. The processor has a configuration to control depositing a first spacer layer on the first portion using the first plasma process. The processor has a third configuration to control etching of the first spacer layer to form a second portion of the first multiple cycle spacer on the first portion using second plasma particles at a second plasma process. The processor has a configuration to continuously repeat a cycle comprising the depositing and etching operations until the first multiple cycle spacer having a predetermined thickness is formed. The processor has a configuration to control removing of the first patterned feature from the first multiple cycle spacer. The processor has a configuration to control depositing of a second spacer layer on the first multiple cycle spacer using the first plasma process. The processor has a configuration to control etching of the second spacer layer using the second plasma process to form a first portion of a second multiple cycle spacer. The processor has a configuration to control continuously repeating a cycle comprising the depositing and etching operations until the second multiple cycle spacer having a predetermined thickness is formed.

In one embodiment, a system to manufacture an electronic device comprises a processing chamber. The processing chamber comprises a pedestal to hold a workpiece comprising a first patterned feature over a substrate. A plasma source is coupled to the processing chamber to generate first plasma particles at a first plasma process. A processor is coupled to the plasma source. The processor has a configuration to control forming of a first portion of a first multiple cycle spacer on a sidewall of the first patterned feature. The processor has a configuration to control depositing a first spacer layer on the first portion using the first plasma process. The processor has a configuration to control etching of the first spacer layer to form a second portion of the first multiple cycle spacer on the first portion using second plasma particles at a second plasma process. The processor has a configuration to continuously repeat a cycle comprising the depositing and etching operations until the first multiple cycle spacer having a predetermined thickness is formed. The processor has a configuration to control at least one of a pressure, a temperature, a time, bias power, source power, a first gas chemistry, a first gas flow, or any combination thereof.

In an embodiment, an apparatus to manufacture an electronic device comprises a top surface, a bottom surface and a plurality of spacer layers between the top surface and the bottom surface. The plurality of spacer layers comprise a first spacer layer on a sidewall of a patterned feature on a device layer over a substrate, a second spacer layer on the first spacer layer and a third spacer layer on the second spacer layer. The width of the plurality of spacer layers at the top surface is substantially similar to the width of the of the plurality of spacer layer portions at the bottom surface.

In an embodiment, an apparatus to manufacture an electronic device comprises a top surface, a bottom surface and a plurality of spacer layers between the top surface and the bottom surface. The plurality of spacer layers comprise a first spacer layer on a sidewall of a patterned feature on a device layer over a substrate, a second spacer layer on the first spacer layer and a third spacer layer on the second spacer layer. The width of the plurality of spacer layers at the top surface is substantially similar to the width of the of the plurality of spacer layer portions at the bottom surface. The top surface of the multiple cycle spacer is substantially parallel to the device layer.

In an embodiment, an apparatus to manufacture an electronic device comprises a top surface, a bottom surface, a plurality of spacer layers between the top surface and the bottom surface, and a side surface coupled to the top surface and the bottom surface. The plurality of spacer layers comprise a first spacer layer on a sidewall of a patterned feature on a device layer over a substrate, a second spacer layer on the first spacer layer and a third spacer layer on the second spacer layer. The width of the plurality of spacer layers at the top surface is substantially similar to the width of the of the plurality of spacer layer portions at the bottom surface. The side surface is substantially perpendicular to the device layer.

In an embodiment, an apparatus to manufacture an electronic device comprises a top surface, a bottom surface and a plurality of spacer layers between the top surface and the bottom surface. The plurality of spacer layers comprise a first spacer layer on a sidewall of a patterned feature on a device layer over a substrate, a second spacer layer on the first spacer layer and a third spacer layer on the second spacer layer. The width of the plurality of spacer layers at the top surface is substantially similar to the width of the of the plurality of spacer layer portions at the bottom surface. The thickness of each of the spacer layers is from about 5 nm to about 10 nm.

In an embodiment, an apparatus to manufacture an electronic device comprises a top surface, a bottom surface and a plurality of spacer layers between the top surface and the bottom surface. The plurality of spacer layers comprise a first spacer layer on a sidewall of a patterned feature on a device layer over a substrate, a second spacer layer on the first spacer layer and a third spacer layer on the second spacer layer. The width of the plurality of spacer layers at the top surface is substantially similar to the width of the of the plurality of spacer layer portions at the bottom surface. Each of the spacer layers is a nitride layer.

In an embodiment, an apparatus to manufacture an electronic device comprises a top surface, a bottom surface and a plurality of spacer layers between the top surface and the bottom surface. The plurality of spacer layers comprise a first spacer layer on a sidewall of a patterned feature on a device layer over a substrate, a second spacer layer on the first spacer layer and a third spacer layer on the second spacer layer. The width of the plurality of spacer layers at the top surface is substantially similar to the width of the of the plurality of spacer layer portions at the bottom surface. The width of the plurality of spacer layers is from about 20 nm to about 150 nm.

Other features of the present invention will be apparent from the accompanying drawings and from the detailed description which follows.

BRIEF DESCRIPTION OF THE DRAWINGS

The embodiments as described herein are illustrated by way of example and not limitation in the figures of the accompanying drawings in which like references indicate similar elements.

DETAILED DESCRIPTION

Figure 1A:
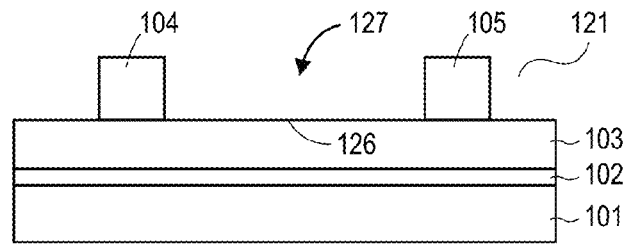
FIG. 1A is a side view of a workpiece to manufacture an electronic device according to one embodiment of the invention.

In the following description, numerous specific details, such as specific materials, chemistries, dimensions of the elements, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment of the invention. Furthermore, the particular features, structures, or characteristics may be combined in any suitable manner in one or more embodiments.

Moreover, inventive aspects lie in less than all the features of a single disclosed embodiment of the invention. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Methods and apparatuses to provide a single-platform multiple cycle spacer deposition and etch technique are described. In one embodiment, a first portion of a multiple cycle spacer is formed on a sidewall of a patterned feature over a substrate. A spacer layer is deposited on the first portion using a first plasma process. The spacer layer is etched to form a second portion of the multiple cycle spacer on the first portion using a second plasma process. A cycle comprising depositing and etching of the spacer layer is continuously repeated until the multiple cycle spacer having a predetermined thickness is formed.

In an embodiment, a multiple cycle spacer is formed using multiple cycles of thin spacer layer deposition and etch to increase flatness of a top portion of the spacer and to eliminate shoulder loss (recession), spacer footing, and decrease CD non-uniformity. In an embodiment, a single-platform system is used to achieve this multiple cycle deposition and etch scheme, as described in further detail below.

In an embodiment, the multiple cycles of the thin spacer layer deposition and etch provides an advantage of substantially reducing faceting, footing, and spacer width loading effect, so that control over the feature critical dimension (CD) and critical dimension uniformity (CDU) after patterning is increased comparing with existing spacer manufacturing techniques. In an embodiment, the multiple cycle spacer deposition and etch advantageously generates a spacer having a top portion that is substantially flatter than the top portion of the spacer produced by existing techniques that involve only one cycle of the thick spacer film deposition and etch. In an embodiment, the multiple cycle thin spacer layer deposition and etch substantially eliminate the spacer faceting, footing, and width variation due to the pattern loading effect. The substantially flat spacer top portion increases control over the underlying patterning profile, CD, and CDU comparing with existing spacer top portions. In an embodiment, the multiple cycle spacer deposition and etch provides an advantage of saving one or more layers of hard mask transfer as multiple cycles of deposition and etch of one spacer layer are performed directly on top of another spacer layer for triple, quadruple, or other self aligned multiple patterning techniques.

FIG. 1A is a side view 100 of a workpiece to manufacture an electronic device according to one embodiment of the invention. The workpiece comprises a substrate 101. In an embodiment, substrate 101 includes a semiconductor material, e.g., silicon ("Si"), germanium ("Ge"), silicon germanium ("SiGe"), a III-V materials based material e.g., gallium arsenide ("GaAs"), or any combination thereof. In one embodiment, substrate 101 includes metallization interconnect layers for integrated circuits. In one embodiment, substrate 101 includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, substrate 101 includes interconnects, for example, vias, configured to connect the metallization layers.

In one embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon. An insulating layer 102 is deposited on substrate 101. In one embodiment, insulating layer 102 is an oxide layer, e.g., silicon oxide, aluminum oxide ("Al2O3"), silicon oxide nitride ("SiON"), a silicon nitride layer, any combination thereof, or other electrically insulating layer determined by an electronic device design. In one embodiment, insulating layer 102 comprises an interlayer dielectric (ILD), e.g., silicon dioxide. In one embodiment, insulating layer 102 includes polyimide, epoxy, photodefinable materials, such as benzocyclobutene (BCB), and WPR-series materials, or spin-on-glass. In an embodiment, insulating layer 102 is an insulating layer suitable to insulate adjacent devices and prevent leakage.

Insulating layer 102 can be deposited using one of a deposition techniques, such as but not limited to a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

In an embodiment, the thickness of the insulating layer 102 is from about 2 nanometers ("nm") to about 50 nm.

A device layer 103 is deposited on insulating layer 102. In an embodiment, device layer 103 comprises a semiconductor material, e.g., monocrystalline or amorphous silicon ("Si"), germanium ("Ge"), silicon germanium ("SiGe"), a III-V materials based material (e.g., gallium arsenide ("GaAs")), or any combination thereof. In an embodiment, device layer 103 comprises a metal, for example, copper (Cu), aluminum (Al), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), vanadium (V), molybdenum (Mo), palladium (Pd), gold (Au), platinum (Pt), polysilicon, other conductive layer known to one of ordinary skill in the art of electronic device manufacturing, or any combination thereof. In an embodiment, device layer 202 is a stack of one or more device layers.

Device layer 202 can be deposited using one of a deposition techniques, such as but not limited to a chemical vapour deposition ("CVD"), e.g., a Plasma Enhanced Chemical Vapour Deposition ("PECVD"), a physical vapour deposition ("PVD"), molecular beam epitaxy ("MBE"), metalorganic chemical vapor deposition ("MOCVD"), atomic layer deposition ("ALD"), or other deposition techniques known to one of ordinary skill in the art of electronic device manufacturing.

In an embodiment, the thickness of the device layer 202 is from about 20 nanometers ("nm") to about 5 micron ($\mu$m"). In more specific embodiment, the thickness of the device layer 202 is from about 25 nm to about 200 nm.

A patterned layer 121 comprising a plurality of features, such as a feature 104 and a feature 105 is deposited on device layer 103. The patterned features are separated by a distance, e.g., a distance 127, as shown in FIG. 1A. In an embodiment, distance 127 is determined by design. In an embodiment, distance 127 is in an approximate range from about 2 nm to about 200 nm. In an embodiment, patterned layer 121 is a hard mask layer, for example, a silicon carbide, aluminum nitride, amorphous Si, or silicon oxide, or other material layer that is selective to the substrate. In an embodiment, patterned layer 121 is an amorphous carbon hard mask layer. In an embodiment, patterned layer 121 comprises a boron doped amorphous carbon layer (BACL) manufactured by Applied Materials, Inc. located in Santa Clara, Calif., or other BACL.

In an embodiment, each of the patterned features 103 and 104 can be a gate stack or dual-damascene trench stack comprising one or more device layers. In an embodiment, the thickness of the patterned layer 121 that defines the height of the features 104 and 105 is from about 20 nm to about 5 $\mu$m. In more specific embodiment, the thickness of the patterned layer 121 is from about 20 nm to about 100 nm. The patterned layer 121 can be deposited and patterned using deposition and patterning techniques known to one of ordinary skill in the art of electronic device manufacturing.

Figure 1B:
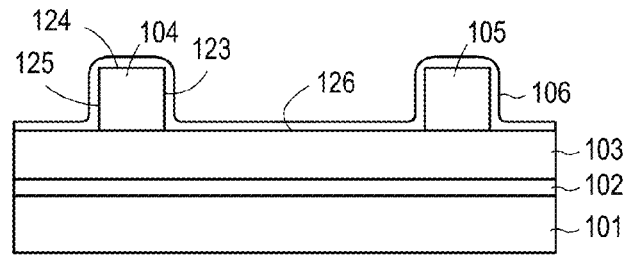
FIG. 1B is a view similar to FIG. 1A after a first cycle spacer layer is conformally deposited on patterned layer according to one embodiment of the invention.

FIG. 1B is a view 110 similar to FIG. 1A after a first cycle spacer layer 106 is conformally deposited on patterned layer 121 according to one embodiment of the invention. As shown in FIG. 1B, first cycle spacer layer 106 is deposited on top portions, such as a top portion 124 and sidewalls of the patterned features, such as sidewalls 123 and 125, and on an exposed portion 126 of the device layer 103.

In an embodiment, the first cycle spacer layer 106 is deposited on the patterned features over the substrate to the thickness from about 2 nm to about 15 nm. In more specific embodiment, the first cycle spacer layer 106 is deposited on the patterned features over the substrate to the thickness from about 5 nm to about 10 nm. In an embodiment, the spacer layer is a nitride film, for example a silicon nitride film, titanium nitride, or any other nitride film. In an embodiment, the spacer layer is silicon oxide, silicon carbide, silicon nitride doped with carbon, silicon oxynitride, titanium oxide, aluminum oxide, other material layer that is different from the material of the patterned features, or other spacer layer known to one of ordinary skill in the art of electronic device manufacturing.

In an embodiment, the spacer layer is deposited on the patterned features over the substrate using plasma particles generated from a gas supplied to a plasma chamber. The patterned features are subjected to a treatment by plasma comprising plasma particles, for example, ions, electrons, radicals, or any combination thereof generated from a gas. In an embodiment, a gas to generate plasma particles for depositing the spacer layer comprises Tetraethyl Orthosilicate (TEOS), Trimethylsilyl (TMS), other gas mixture, or any combination thereof. In an embodiment, the nitride spacer layer is deposited using plasma particles generated from a gas comprising nitrogen, silane, NH3, N2. In an embodiment, the plasma particles chemically attach to the top and side surfaces of the patterned features 104 and 105 and exposed portions of the device layer 103 to form first cycle spacer layer 106.

Figure 8:
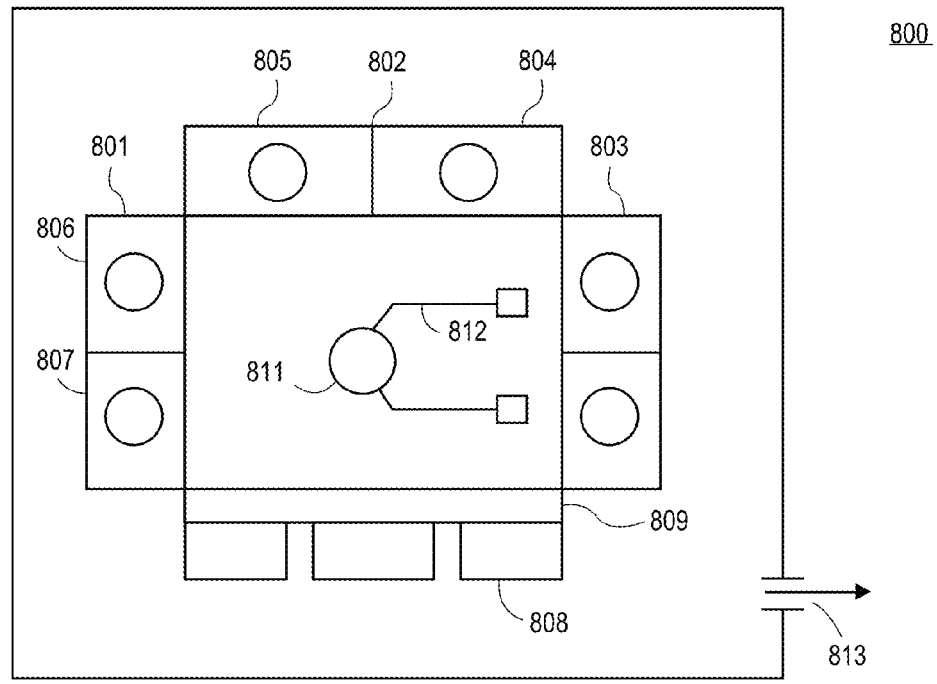
FIG. 8 shows a block diagram of one embodiment of a processing system to perform one or more methods described herein.
Figure 9:
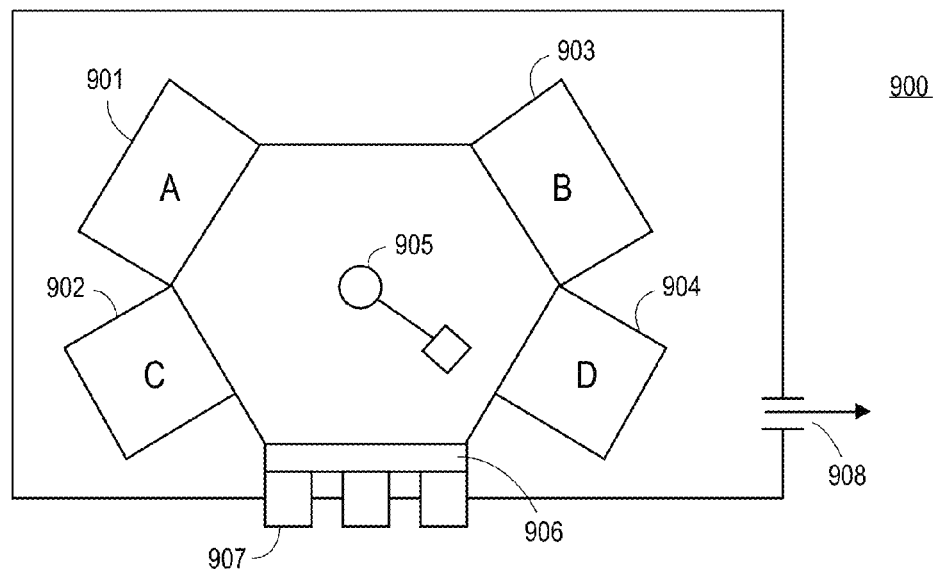
FIG. 9 shows a block diagram of one embodiment of a processing system to perform one or more methods described herein.
Figure 10:
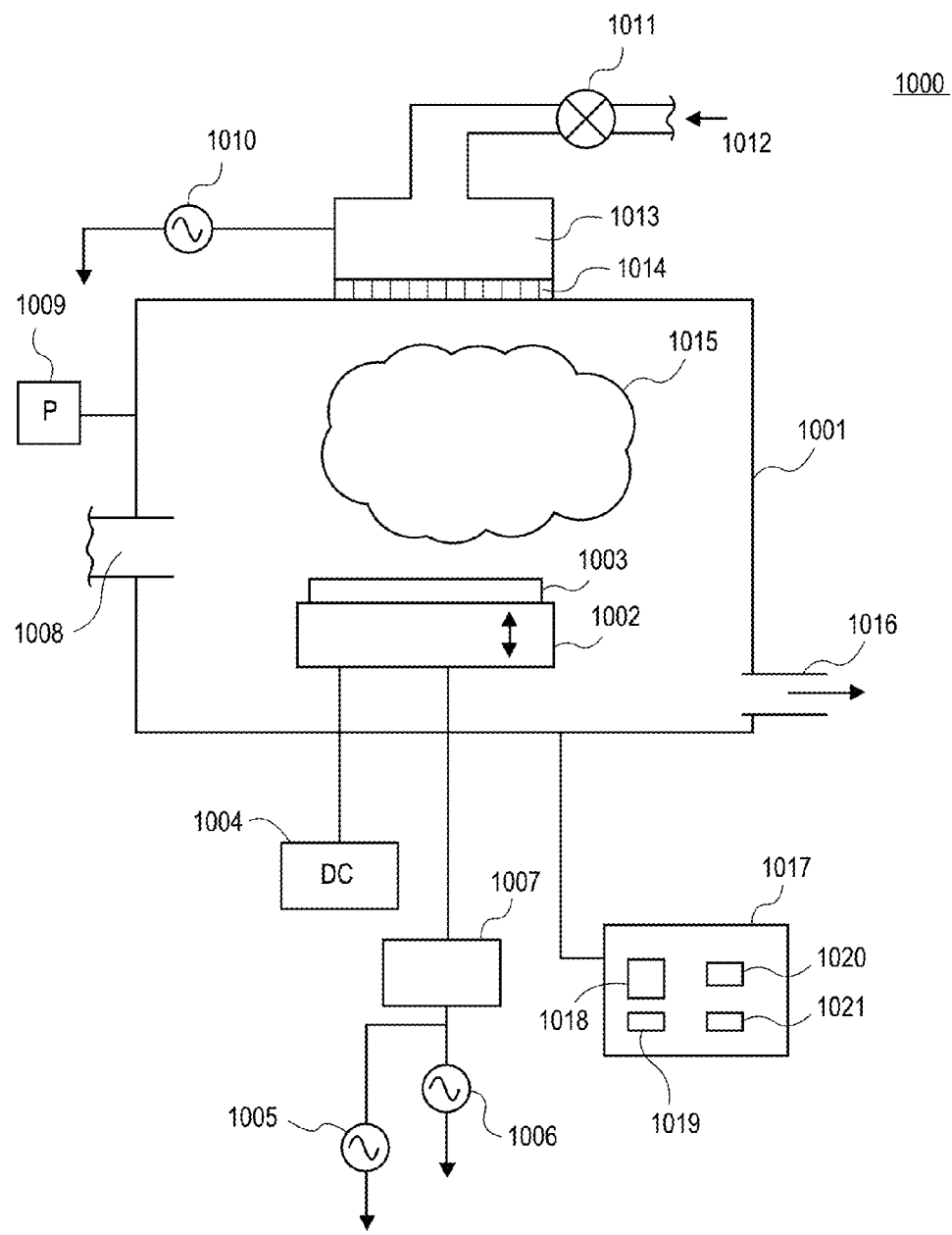
FIG. 10 shows a block diagram of one embodiment of a plasma system to provide multiple cycle spacer deposition and etch according to one embodiment of the invention.

In an embodiment, the first cycle spacer layer 106 is deposited in a plasma system, for example in one of the plasma systems depicted in FIGS. 8, 9, and 10, or any other plasma system. One or more parameters of the plasma system, for example, a pressure provided to the plasma chamber, a plasma source power, a bias power, a process gas flow, a process gas chemistry, a temperature, deposition time, or any combination thereof are adjusted to deposit the first cycle spacer layer 106. In an embodiment, the spacer layer deposition is performed in the plasma chamber with an inductively coupled plasma (ICP) source, capacitively-coupled plasma (CCP) source, or a remote plasma source (RPS).

In an embodiment, the nitride spacer layer is deposited on the patterned features using plasma in a plasma chamber at a pressure from about 2 Torr to about 10 Torr, at a source power from about 100 W to about 3000 W at a frequency from about 13.56 MHz to about 162 MHz, at a bias power not greater than 1000 W at a frequency between about 2 MHz to 60 MHz, and in a particular embodiment, at about 13 MHz at a temperature greater than 100° C., for a time duration from about 5 sec-about 100 sec. In an embodiment, the total flow of the gas supplied to the plasma chamber to deposit first cycle spacer layer 106 is from about 1000 standard cubic centimeters per minute ("sccm") to about 5000 sccm.

In an embodiment, the spacer layer is deposited on the patterned features over the substrate using plasma particles generated from a gas in the plasma chamber at a temperature from about 100° C. to about 400° C., and in more specific embodiment, at a temperature about 400° C. In an embodiment, the spacer layer is deposited on the patterned features over the substrate in a plasma chamber at a processing pressure of about 8 Torr. In an embodiment, the spacer layer is deposited on the patterned features over the substrate in a plasma chamber having total input processing gas flow about 2000 sccm.

In an embodiment, depositing of the spacer layer is performed in a plasma chamber using a sub-atmospheric chemical vapor deposition (SACVD) technique, a low pressure chemical vapor deposition (LPCVD) technique, a plasma enhanced chemical vapor deposition (PECVD) technique, a high density plasma chemical vapor deposition (HDP-CVD) technique, an atomic layer deposition (ALD) technique, or other conformal deposition techniques known to one of ordinary skill in the art of electronic device manufacturing.

Figure 1C:
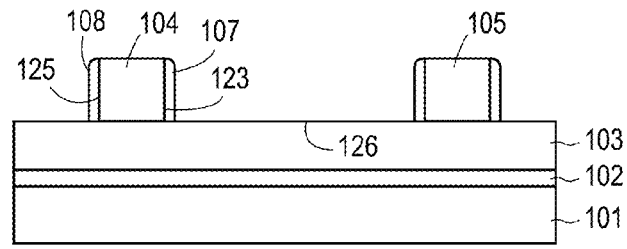
FIG. 1C is a view similar to FIG. 1B, after first cycle spacer portions are formed on sidewalls of patterned features over a substrate according to one embodiment of the invention.

FIG. 1C is a view 120 similar to FIG. 1B, after first cycle spacer portions are formed on sidewalls of patterned features over a substrate according to one embodiment of the invention. As shown in FIG. 1C, a first cycle spacer portion 107 is formed on sidewall 123, a first cycle spacer portion 108 is formed on sidewall 125 of the patterned feature 104. As shown in FIGS. 1B and 1C, the portions of the first cycle spacer layer 106 on the top portions of the patterned features 104 and 105, and on the portions of the device layer 103 exposed by the patterned features 104 and 105 are removed.

In an embodiment, the portions of the first cycle spacer layer 106 are removed using one of the plasma etching techniques known to one of ordinary skill in the art of electronic device manufacturing.

In an embodiment, the first cycle spacer layer 106 on the top portions of the patterned features 104 and 105 and on the portions of the device layer 103 exposed by the patterned features 104 and 105 is etched using plasma particles for example, ions, electrons, radicals, or any combination thereof, generated from a gas supplied to a plasma chamber. In an embodiment, a gas mixture to generate plasma particles for etching the portions of the spacer layer comprises one or more halogen gases, fluoro-carbon gases, hydro-fluoro-carbon gases, ammonia, nitrogen trifluoride, and inert gases e.g., argon and helium, silane, other gases, or any combination thereof.

In an embodiment, the spacer layer is etched in a plasma system, for example in one of the plasma systems depicted in FIGS. 8, 9, and 10, or any other plasma system. One or more parameters of the plasma system, for example, a pressure provided to the plasma chamber, a plasma source power, a bias power, a process gas flow, a process gas chemistry, a temperature, etch time, or any combination thereof are adjusted to etch the spacer layer. In an embodiment, the spacer layer etch is performed in the plasma chamber with an inductively coupled plasma source, capacitively-coupled plasma source, or a remote plasma source.

In an embodiment, the nitride spacer layer is etched using the plasma particles in a plasma chamber at a pressure from about 1 mTorr to about 30 mTorr, and in more specific embodiment, at about 25 mTorr; at a source power from about 100 W to about 3000 W at a frequency from about 13.56 MHz to about 162 MHz, at a bias power not greater than 1000 W, at a frequency between about 2 MHz to 60 MHz, and in a particular embodiment at about 13 MHz, at a temperature from about 15° C. to about 30° C., and in more specific embodiment at about 20° C., for a time duration from about 5 sec to about 100 sec, at the total gas flow into the plasma chamber from about 100 sccm to about 200 sccm, and in more specific embodiment at about 150 sccm. In another embodiment, the nitride spacer layer is etched using the plasma particles in a plasma chamber at a pressure from about 20 mTorr to about 1.5 Torr; at a source power from about 100 W to about 3000 W at a frequency from about 13.56 MHz to about 162 MHz, at a bias power not greater than 1000 W at a frequency between about 2 MHz to 60 MHz, and in a particular embodiment at about 13 MHz, at a temperature from about 80° C. to about 110° C., for a time duration from about 5 sec to about 100 sec, at the total gas flow into the plasma chamber from about 600 sccm to about 5000 sccm.

In an embodiment, the total flow of the gas supplied to the plasma chamber to etch the spacer layer is from about 50 sccm to about 2000 sccm. In an embodiment, the spacer layer is etched using plasma particles generated from a gas in the plasma chamber at a temperature from about 15° C. to about 110° C. In an embodiment, the spacer layer is etched in the plasma chamber at a processing pressure from about 1 mTorr to about 10 Torr.

Figure 1D:
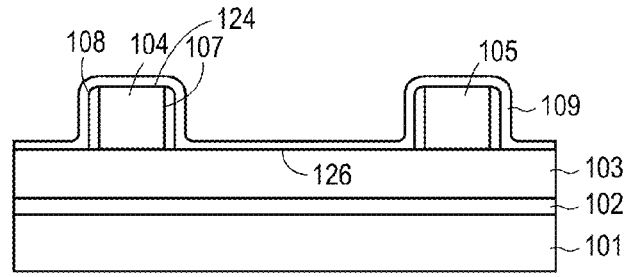
FIG. 1D is a view similar to FIG. 1C after a second cycle spacer layer is conformally deposited on the portions of the multiple cycle spacers according to one embodiment of the invention.

FIG. 1D is a view 130 similar to FIG. 1C after a second cycle spacer layer 109 is conformally deposited on the portions of the multiple cycle spacers according to one embodiment of the invention. As shown in FIG. 1D, the second cycle spacer layer 109 is deposited on top portions of the patterned features 104 and 105, such as top portion 124, on the first spacer portions adjacent to the patterned features 104 and 105, such as first spacer portions 107 and 108, and on portion 126 of the device layer 103.

In an embodiment, the second cycle spacer layer 109 is deposited on the patterned features over the substrate to the thickness from about 2 nm to about 15 nm. In more specific embodiment, the spacer layer is deposited on the patterned features over the substrate to the thickness from about 5 nm to about 10 nm.

In an embodiment, the thickness of the second cycle spacer layer 109 is substantially the same as the thickness of the first cycle spacer layer 106. In an embodiment, the spacer layer is a nitride film, for example a silicon nitride film. In an embodiment, the spacer layer is silicon oxide, silicon carbide, silicon nitride doped with carbon, silicon oxynitride, titanium oxide, aluminum oxide, other material layer that is different from the material of the patterned features, or other spacer layer known to one of ordinary skill in the art of electronic device manufacturing. In an embodiment, the material of the second cycle spacer layer 109 is substantially the same as the material of the first cycle spacer layer 106. In an embodiment, the second cycle spacer layer 109 is deposited on the patterned features over the substrate using plasma particles generated from a gas supplied to a plasma chamber, as described above with respect to first cycle spacer layer 106.

Figure 1E:
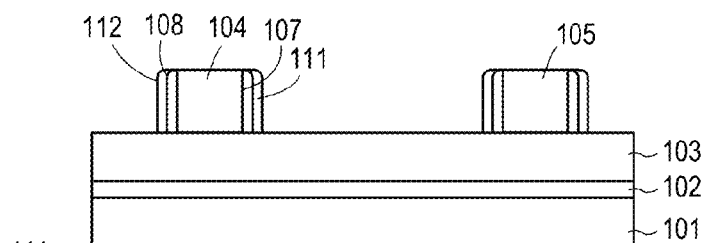
FIG. 1E is a view similar to FIG. 1D, after the second cycle spacer layer is etched to form second cycle spacer portions according to one embodiment of the invention.

FIG. 1E is a view 140 similar to FIG. 1D, after the second cycle spacer layer 109 is etched to form second cycle spacer portions according to one embodiment of the invention. As shown in FIG. 1D, the second cycle spacer portions are formed on the first cycle spacer portions, such as second cycle spacer portions 111 and 112. As shown in FIGS. 1D and 1E, the portions of the second cycle spacer layer 109 are removed from the top portions of the patterned features 104 and 105, and the exposed portions of the device layer 103. In an embodiment, the portions of the second cycle spacer layer 109 are removed using one or more of the plasma etching techniques as described above with respect to first cycle spacer layer 106.

Figure 1F:
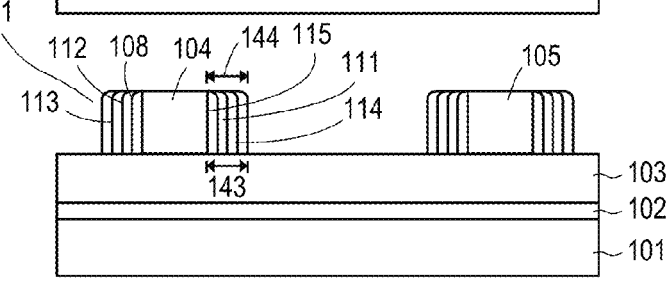
FIG. 1F is a view similar to FIG. 1D, after multiple cycle spacers are formed on the sidewalls of the patterned features according to one embodiment of the invention.

FIG. 1F is a view 150 similar to FIG. 1D, after multiple cycle spacers are formed on the sidewalls of the patterned features according to one embodiment of the invention. In an embodiment, a cycle involving depositing and etching of the spacer layer as described above with respect to FIGS. 1C and 1D is continuously repeated a multiple times until a multiple cycle spacer having a predetermined thickness is formed. In an embodiment, the cycle involving depositing and etching of the spacer layer is repeated at least three times. In more specific embodiment, the cycle involving depositing and etching of the spacer layer is repeated about 5 to 6 times to form the multiple cycle spacer having a thickness in an approximate range of 30 nm to 60 nm. In an embodiment, the multiple cycle spacer comprises at least three spacer layers (portions). In an embodiment, the multiple cycle spacer comprises about 3 to 6 spacer layers (portions). In an embodiment, the depositing and etching operations are performed on a single platform, for example, in the same plasma chamber, in the same vacuum system, or both.

As shown in FIG. 1F, multiple cycle spacers are formed on the sidewalls of the patterned features, such as a multiple cycle spacer 115 and a multiple cycle spacer 141. Each of the multiple cycle spacers comprises a plurality of spacer layers (portions). As shown in FIG. 1F, multiple cycle spacer 115 comprises a spacer portion 114 on spacer portion 111 on spacer portion 107 on sidewall 123 of the patterned feature 104. Multiple cycle spacer 141 comprises a spacer portion 113 on spacer portion 112 on spacer portion 109 on sidewall 125 of the patterned feature 104. As shown in FIG. 1F, a width 143 at the bottom of the multiple cycle spacer 115 is substantially the same as a width 144 at the top of the multiple cycle spacer 115. As shown in FIG. 1F, the top surface of multiple cycle spacer 115 is substantially parallel to top surface of the device layer 103, so that a shoulder recess at the top surface of the multiple cycle spacer is substantially eliminated. As shown in FIG. 1F, the multiple cycle spacer top is substantially flatter than the top of a single cycle spacer fabricated using a conventional technique that increases control over the patterning profile, CD, and CDU of the underlying device layer 103. As shown in FIG. 1F, the side surface of the multiple cycle spacer 115 is substantially perpendicular to the top surface device layer, so that tapering (footing) at the bottom of the multiple cycle spacer is substantially eliminated. As shown in FIG. 1F, the multiple cycle spacers, e.g, multiple cycle spacers 115 and 141 have similar width. In an embodiment, the width of each of the multiple cycle spacers is from about 20 nm to about 150 nm. In an embodiment, the width of each of the multiple cycle spacers is from about 20 nm to about 50 nm.

Figure 1G:
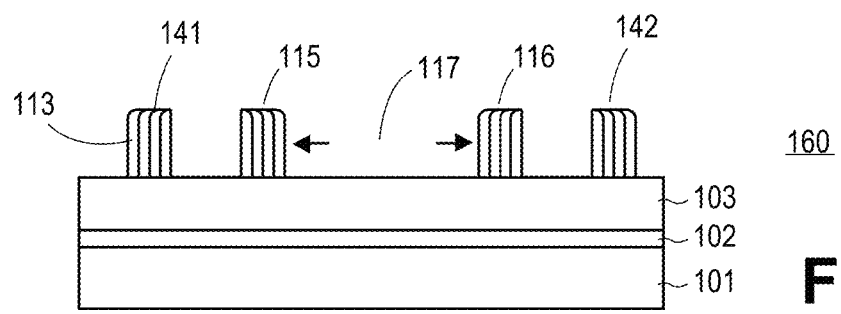
FIG. 1G is a view similar to FIG. 1F after the patterned features are removed according to one embodiment of the invention.

FIG. 1G is a view 160 similar to FIG. 1F after the patterned features 104 and 105 are removed according to one embodiment of the invention. As shown in FIG. 1G, the patterned features 104 and 105 are removed to form a plurality of multiple cycle spacers, such as spacers 115, 116, 141 and 142 on device layer 103. As shown in FIG. 1G, a distance 117 between the multiple cycle spacers 115 and 116 is about a half of distance 127. In other words, the pattern pitch depicted in FIG. 1G is doubled comparing with the pattern pitch depicted in FIG. 1A.

In an embodiment, the patterned features 104 and 105 are removed by etching in a plasma chamber as depicted in FIGS. 8, 9, and 10, or any other plasma chamber using one of the plasma etching techniques known to one of ordinary skill in the art of electronic device manufacturing. One or more parameters of the plasma system, for example, a pressure provided to the plasma chamber, a plasma source power, a bias power, a process gas flow, a process gas chemistry, a temperature, or any combination thereof are adjusted to etch the patterned features 104 and 105.

Figure 1H:
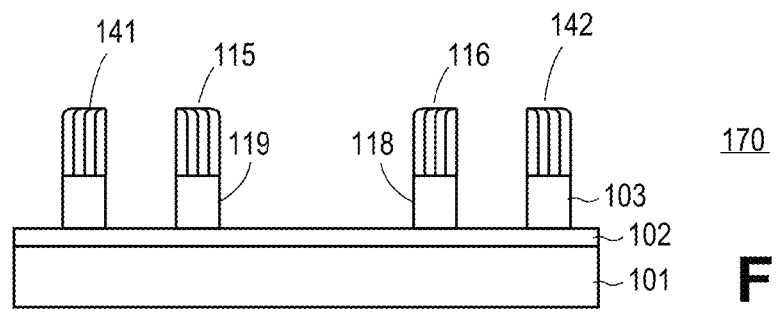
FIG. 1H is a view similar to FIG. 1G after the device layer is etched using the multiple cycle spacer as a mask according to one embodiment of the invention.

FIG. 1H is a view 170 similar to FIG. 1G after the device layer 103 is etched using the multiple cycle spacer as a mask according to one embodiment of the invention. As shown in FIG. 1H, the device layer 103 is etched down to an insulating layer 102 using the multiple cycle spacers 115, 116, 141, and 142 as a mask. The portions of the device layer 103 underneath the multiple cycle spacers, such as portions 119 and 118 are left intact by etching. In an embodiment, device layer 103 is etched in a plasma chamber as depicted in FIGS. 8, 9, and 10, or any other plasma chamber using one of the plasma etching techniques known to one of ordinary skill in the art of electronic device manufacturing. One or more parameters of the plasma system, for example, a pressure provided to the plasma chamber, a plasma source power, a bias power, a process gas flow, a process gas chemistry, a temperature, or any combination thereof are adjusted to etch the device layer 103.

Figure 1I:
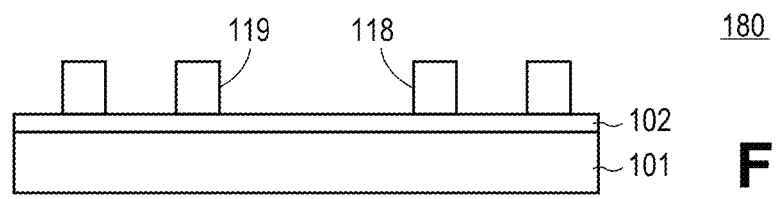
FIG. 1I is a view similar to FIG. 1H after the multiple cycle spacers are removed according to one embodiment of the invention.

FIG. 1I is a view 180 similar to FIG. 1H after the multiple cycle spacers are removed according to one embodiment of the invention. As shown in FIGS. 1H and 1I, the multiple cycle spacers are removed from the portions of the device layer, such as portions 118 and 119. In an embodiment, the portions of the device layer, such as portions 118 and 119 represent device features for example a gate, bitline, contact, capacitor, interconnect, shallow trench isolation, or other one or more electronic device features. In an embodiment, the multiple cycle spacers 115, 116, 141 and 142 are removed using one of the spacer removal techniques known to one of ordinary skill in the art of electronic device manufacturing, for example, using a directional dry etch in a plasma chamber, for example one of the plasma chambers depicted in FIGS. 8, 9 and 10, or any other plasma chamber. In an embodiment, the multiple cycle spacers 115, 116, 141 and 142 are removed using one of wet etching techniques known to one of ordinary skill in the art of electronic device manufacturing. In an embodiment, a chemical mechanical polishing technique known one of ordinary skill in the art is used to remove the remaining portions of the multiple cycle spacers and to planarize the remaining topology.

Figure 2A:
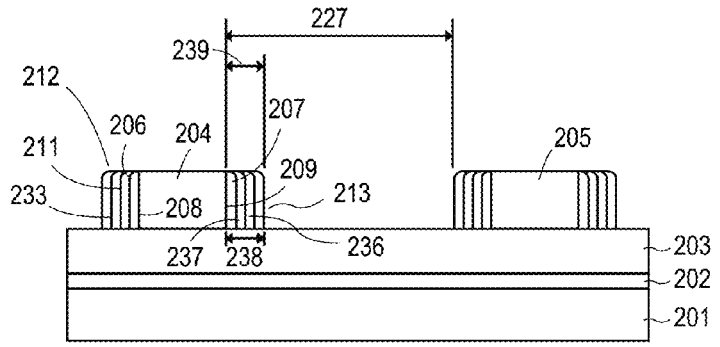
FIG. 2A is a side view of a workpiece to manufacture an electronic device according to one embodiment of the invention.

FIG. 2A is a side view 200 of a workpiece to manufacture an electronic device according to one embodiment of the invention. The workpiece comprises a substrate 201. In an embodiment, substrate 201 represents substrate 101. An insulating layer 202 is deposited on substrate 201. In an embodiment, insulating layer 202 represents insulating layer 102. A device layer 203 is deposited on insulating layer 202.

In an embodiment, device layer 203 represents device layer 103. A patterned layer comprising a plurality of patterned features, such as a patterned feature 204 and a patterned feature 205 are deposited on device layer 203. Patterned features 204 and 205 are separated by a distance 227. In an embodiment, patterned features 204 and 205 represent the patterned features 104 and 105. As shown in FIG. 2A, multiple cycle spacers comprising a plurality of spacer layers (portions), such as a multiple cycle spacer 212 and a multiple cycle spacer 213 are formed on the sidewalls of the patterned features. As shown in FIG. 2A, multiple cycle spacer 212 comprising a layer 233 on a layer 234 on a layer 211 on a layer 206 is formed on a sidewall 208. A multiple cycle spacer 213 comprising a layer 235 on a layer 236 on a layer 237 on a layer 207 is formed on a sidewall 209. In an embodiment, multiple cycle spacers 212 and 213 represent the multiple cycle spacers depicted in FIG. 1F. As shown in FIG. 2A, a width 238 at the bottom of the multiple cycle spacer 212 is substantially the same as a width 239 at the top of the multiple cycle spacer 212.

Figure 2B:
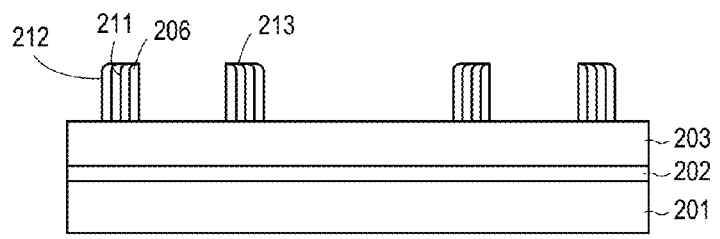
FIG. 2B is a view similar to FIG. 2A after the patterned features are removed according to one embodiment of the invention.

FIG. 2B is a view 210 similar to FIG. 2A after the patterned features 204 and 205 are removed according to one embodiment of the invention. As shown in FIG. 2A, the patterned features 204 and 205 are removed to expose portions of the device layer 203. As shown in FIG. 2A, a plurality of multiple cycle spacers, such as multiple cycle spacers 212 and 213 are formed on device layer 203, as described above with respect to FIG. 1G.

Figure 2C:
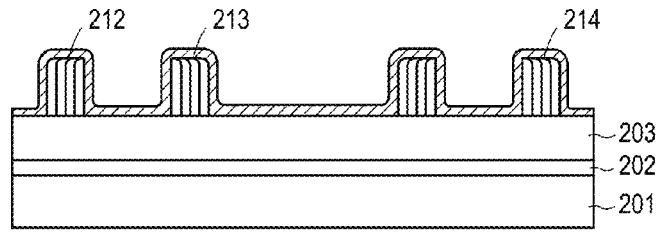
FIG. 2C is a view similar to FIG. 2B after a first cycle spacer layer is conformally deposited on the multiple cycle spacers according to one embodiment of the invention.

FIG. 2C is a view 220 similar to FIG. 2B after a first cycle spacer layer 214 is conformally deposited on the multiple cycle spacers according to one embodiment of the invention. Depositing spacer layer 214 directly onto the multiple cycle spacers provides an advantage as it saves a layer of hard mask transfer for a multiple patterning process. As shown in FIG. 2C, spacer layer 214 is deposited on the top portions and each of the sidewalls of the multiple cycle spacers, such as multiple cycle spacers 212 and 213.

In an embodiment, the spacer layer 214 is deposited to the thickness from about 2 nm to about 15 nm. In more specific embodiment, the spacer layer 214 is deposited to the thickness from about 5 nm to about 10 nm.

In an embodiment, the spacer layer 214 is a nitride film, for example a silicon nitride film. In an embodiment, the spacer layer is silicon oxide, silicon carbide, silicon nitride doped with carbon, silicon oxynitride, titanium oxide, aluminum oxide, other material layer that is different from the material of the patterned features, or other spacer layer known to one of ordinary skill in the art of electronic device manufacturing. In an embodiment, the material of the spacer layer 214 is substantially the same as the material of the first multiple cycle spacers, such as multiple cycle spacers 212 and 213. In an embodiment, the spacer layer 214 is deposited on the patterned features over the substrate using plasma particles generated from a gas supplied to a plasma chamber, as described above with respect to the spacer layers 106 and 109.

Figure 2D:
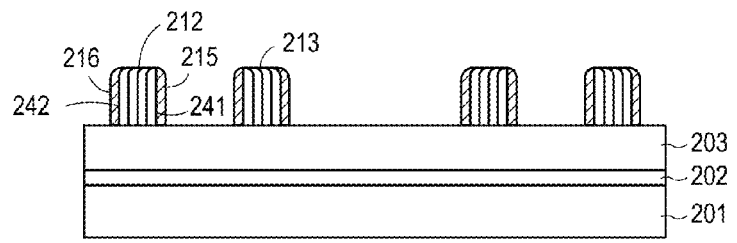
FIG. 2D is a view similar to FIG. 2C after the spacer layer is etched to form a first cycle spacer portion according to one embodiment of the invention.

FIG. 2D is a view 230 similar to FIG. 2C after the spacer layer 214 is etched to form a first cycle spacer portion according to one embodiment of the invention. As shown in FIG. 2D, a first cycle spacer portion 215 is formed on a sidewall 241, and a first cycle spacer portion 216 is formed on a sidewall 242 of the multiple cycle spacer 213. As shown in FIGS. 2C and 2D, the portions of the spacer layer 214 are removed from the tops of the multiple cycle spacers, such as spacers 212 and 213 and from the exposed portions of the device layer 203. In an embodiment, the portions of the spacer layer 214 are removed using one or more of the plasma etching techniques as described above with respect to spacer layers 106 and 109.

Figure 2E:
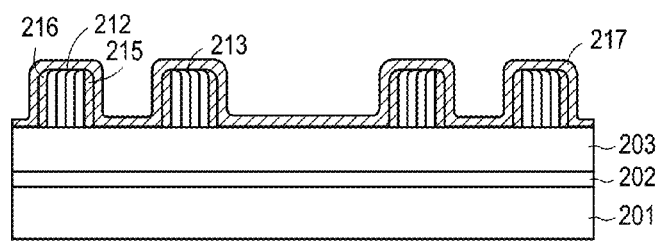
FIG. 2E is a view similar to FIG. 2D after a second cycle spacer layer is conformally deposited on the first spacer portions of the second multiple cycle spacers according to one embodiment of the invention.

FIG. 2E is a view 240 similar to FIG. 2D after a second cycle spacer layer 217 is conformally deposited on the first spacer portions of the second multiple cycle spacers according to one embodiment of the invention. As shown in FIG. 2D, spacer layer 217 is deposited on the top portions the multiple cycle spacers, such as multiple cycle spacers 212 and 213 and on the first cycle spacer portions, such as first cycle spacer portions 215 and 216. In an embodiment, the spacer layer 217 is deposited to the thickness from about 2 nm to about 15 nm. In more specific embodiment, the spacer layer 217 is deposited to the thickness from about 5 nm to about 10 nm.

In an embodiment, the spacer layer 217 is a nitride film, for example a silicon nitride film. In an embodiment, the spacer layer is silicon oxide, silicon carbide, silicon nitride doped with carbon, silicon oxynitride, titanium oxide, aluminum oxide, other material layer that is different from the material of the patterned features, or other spacer layer known to one of ordinary skill in the art of electronic device manufacturing. In an embodiment, the spacer layer 217 is similar to the spacer layer 214. In an embodiment, the spacer layer 217 is deposited using plasma particles generated from a gas supplied to a plasma chamber, as described above with respect to the spacer layers.

Figure 2F:
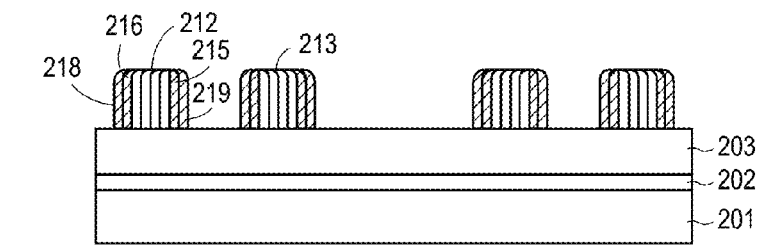
FIG. 2F is a view similar to FIG. 2E after the spacer layer is etched to form a second cycle spacer portion according to one embodiment of the invention.

FIG. 2F is a view 250 similar to FIG. 2E after the spacer layer 217 is etched to form a second cycle spacer portion according to one embodiment of the invention. In an embodiment, the second cycle spacer portions, such as spacer portions 218 and 219 are formed on the first spacer portions. As shown in FIG. 2F, a spacer portion 219 is formed on the spacer portion 215, a spacer portion 218 is formed on the spacer portion 216. As shown in FIGS. 2C and 2D, the portions of the spacer layer 217 are removed from the top portions of the multiple cycle spacers, such as multiple cycle spacers 212 and 213 and from the exposed portions of the device layer 203. In an embodiment, the portions of the spacer layer 214 are removed using one or more of the plasma etching techniques as described above with respect to the spacer layers.

Figure 2G:
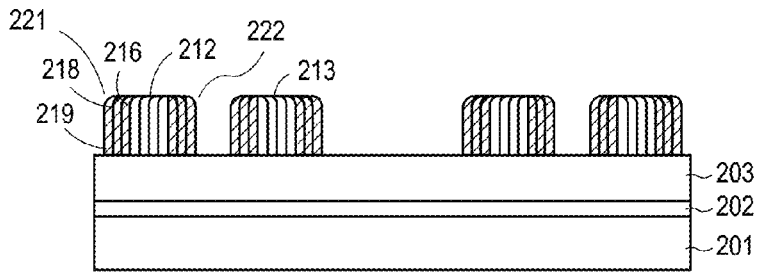
FIG. 2G is a view similar to FIG. 2F, after a second multiple cycle spacer is formed on the sidewalls of the first multiple cycle spacer according to one embodiment of the invention.

FIG. 2G is a view 260 similar to FIG. 2F, after a second multiple cycle spacer is formed on the sidewalls of the first multiple cycle spacer according to one embodiment of the invention. In an embodiment, a cycle involving depositing and etching of the spacer layer as described above with respect to FIGS. 2E and 2F is continuously repeated a number of times until a second multiple cycle spacer having a predetermined thickness is formed. In an embodiment, the cycle involving depositing and etching of the spacer layer is repeated at least three times. In more specific embodiment, the cycle involving depositing and etching of the spacer layer is repeated about 5 to 6 times to form the second multiple cycle spacer having the thickness in an approximate range of 30 nm to 60 nm.

As shown in FIG. 2G, second multiple cycle spacers are formed on the sidewalls of the first multiple cycle spacers, such as second multiple cycle spacers 221 and 222. As shown in FIG. 2G, each of the second multiple cycle spacers, such as multiple cycle spacers 221, 222, and 226 comprises a plurality of layers (portions). Multiple cycle spacer 221 comprises a spacer portion 219 on spacer portion 218 on spacer portion 216 formed on the sidewall of the multiple cycle spacer 212, as shown in FIG. 2G. In an embodiment, the multiple cycle spacer 221 comprises at least three spacer layers. In an embodiment, the multiple cycle spacer 221 comprises about 3 to 6 spacer layers. As shown in FIG. 2G, the width at the bottom of the multiple cycle spacer 221 is substantially the same as the width at the top. As shown in FIG. 2G, the top surface of multiple cycle spacer 221 is substantially parallel to top surface of the device layer 203, so that a shoulder recess at the top surface of the multiple cycle spacer is substantially eliminated. As shown in FIG. 2G, the top portion of the multiple cycle spacer 221 is substantially flatter than the top of a single cycle spacer formed using existing technologies that increases control over the patterning profile, CD, and CDU of the underlying device layer 203. As shown in FIG. 2G, the side surface of the multiple cycle spacer 221 is substantially perpendicular to the top surface device layer 203, so that tapering (footing) at the bottom of the multiple cycle spacer is substantially eliminated. As shown in FIG. 2G, the second multiple cycle spacers, such as multiple cycle spacers 221, 222 and 226 have similar width. In an embodiment, the width of each of the second multiple cycle spacers is from about 20 nm to about 150 nm. In an embodiment, the width of each of the second multiple cycle spacers is from about 20 nm to about 50 nm.

Figure 2H:
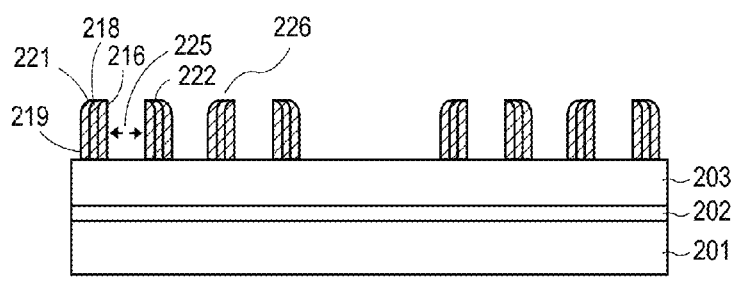
FIG. 2H is a view similar to FIG. 2G after the first multiple cycle spacers are removed according to one embodiment of the invention.

FIG. 2H is a view 270 similar to FIG. 2G after the first multiple cycle spacers, such as spacers 212 and 213 are removed according to one embodiment of the invention. As shown in FIG. 2H, the first multiple cycle spacers are removed to expose portions of the device layer 203. As shown in FIG. 2H, a plurality of second multiple cycle spacers, such as spacers 221, 222 and 226 are formed on device layer 203. As shown in FIG. 2H, a distance 225 between the multiple cycle spacers 221 and 222 is reduced by about a factor of four comparing with the distance 227 between the patterned features 204 and 205. In other words, the pattern pitch depicted in FIG. 2H is quadrupled comparing with the pattern pitch depicted in FIG. 1A.

In an embodiment, the first multiple cycle spacers are removed by etching in a plasma chamber as depicted in FIGS. 8, 9, and 10, or any other plasma chamber using one of the plasma etching techniques, as described above.

Figure 2I:
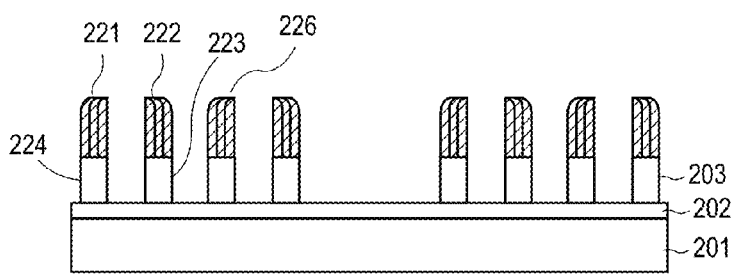
FIG. 2I is a view similar to FIG. 2H after the device layer is etched using the second multiple cycle spacer as a mask according to one embodiment of the invention.

FIG. 2I is a view 280 similar to FIG. 2H after the device layer 203 is etched using the second multiple cycle spacer as a mask according to one embodiment of the invention. As shown in FIG. 2I, the device layer 203 is etched down to an insulating layer 202 using the second multiple cycle spacers, such as multiple cycle spacers 221, 222 and 226 as a mask. As shown in FIG. 2I, the portions of the device layer 203 underneath the multiple cycle spacers are left intact by etching. In an embodiment, device layer 203 is etched in a plasma chamber as depicted in FIGS. 8, 9, and 10, or any other plasma chamber using one of the plasma etching techniques, as described above.

Figure 2J:
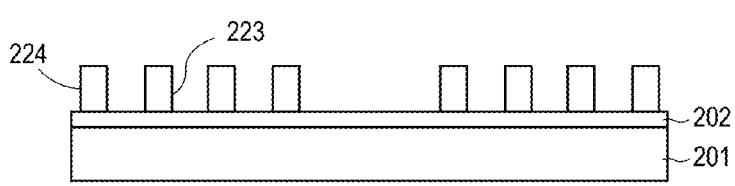
FIG. 2J is a view similar to FIG. 2I after the second multiple cycle spacers are removed according to one embodiment of the invention.

FIG. 2J is a view 290 similar to FIG. 2I after the second multiple cycle spacers are removed according to one embodiment of the invention. As shown in FIGS. 2I and 2J, the second multiple cycle spacers, such as spacers 221, 222, 226 are removed from the corresponding top portions of the device features, such as a feature 223 and a feature 224. In an embodiment, the device features 223 and 224 are for example, gate, bitline, contact, capacitor, interconnect, shallow trench isolation, or other electronic device features. In an embodiment, the second multiple cycle spacers are removed using one of the spacer removal techniques, as described above.

Figure 3:
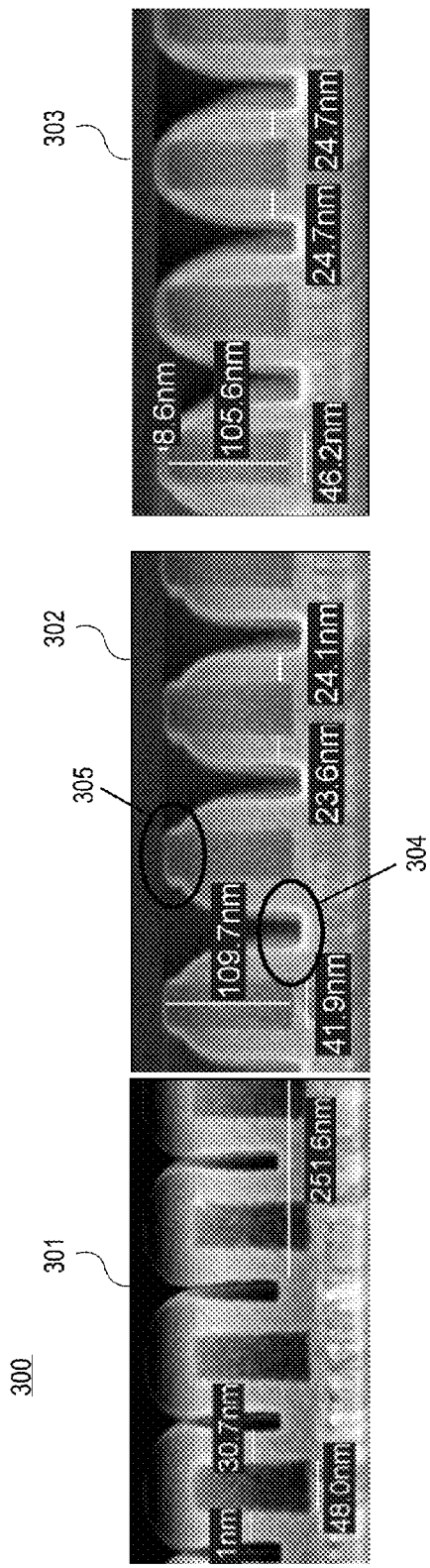
FIG. 3 is a view showing images of exemplary spacer deposition and etch according to one embodiment of the invention.

FIG. 3 is a view 300 showing images of exemplary spacer deposition and etch according to one embodiment of the invention. An image 301 illustrates a single cycle thick spacer layer deposited on patterned features. An image 302 illustrates a spacer formed by etching the single cycle thick spacer layer depicted in image 301 using a conventional technique. As shown in image 302, the spacer has a top shoulder recess 305 and a tapered bottom (footing) 304. As shown in image 302, the width of the spacers deposited on the sidewalls of the patterned features is not uniform. As shown in image 302, the width of the spacers deposited on opposite sidewalls of the feature varies from about 23.6 nm to about 24.1 nm.

An image 303 shows multiple cycle spacers formed on the patterned features by repeating 5 times a cycle of deposition and etch of the spacer layer having the thickness of about 5 nm. As shown in image 303, the multiple cycle spacers have substantially flat tops, so that the shoulder recess 305 is substantially eliminated. As shown in image 303, the sidewalls of the spacers are substantially perpendicular to the substrate, so that footing 304 is substantially eliminated. As shown in image 303, the width of the spacers deposited on the sidewalls of the patterned features is uniform. As shown in image 303, the width of the spacers deposited on opposite sidewalls of the feature is substantially the same.

Figure 4:
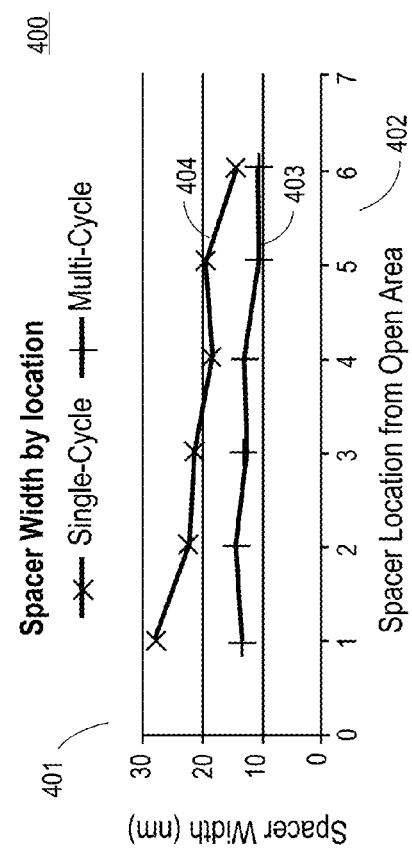
FIG. 4 is a view showing a graph representing a spacer width versus a spacer location from an open area of the design pattern according to one embodiment of the invention.

FIG. 4 is a view 400 showing a graph representing a spacer width 401 versus a spacer location 402 from an open area of the design pattern according to one embodiment of the invention. As shown in FIG. 4, a single cycle thick spacer width 404 varies significantly from about 30 nm to about 12 nm as a function of the spacer location on the design pattern. A multiple cycle spacer width 403 uniformity is substantially increased comparing with the single cycle spacer 403. Multiple cycle spacer width 403 is substantially the same (about 10 nm) along the design pattern, as shown in FIG. 4. As shown in FIG. 4, the width uniformity of the multiple cycle spacer is improved by about 85% comparing with the single cycle spacer.

Figure 5A:
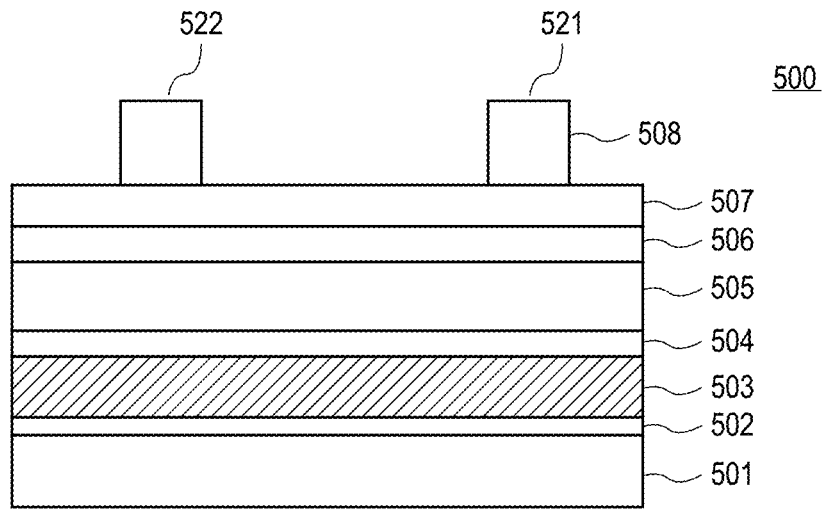
FIG. 5A is a side view of an electronic device structure according to one embodiment of the invention.

FIG. 5A is a side view 500 of an electronic device structure 500 according to one embodiment of the invention. Electronic device structure 500 comprises a substrate 501. In an embodiment, substrate 501 is a silicon substrate. In an embodiment, substrate 501 represents one of substrates described above. In an embodiment, substrate 501 represents one of the device layers described above. In an embodiment, substrate 501 represents one of the device layers on one of the substrates described above. A thin insulating layer 502 is deposited on substrate 501. In an embodiment, insulating layer 502 is an oxide layer. In an embodiment, insulating layer 502 represents one of insulating layers 102 and 202. In an embodiment, the thickness of the insulating layer 502 is from about 2 nm to about 7 nm. In more specific embodiment, the thickness of the insulating layer 502 is about 5 nm. A core layer 503 is deposited on insulating layer. In an embodiment, core layer 503 is an amorphous silicon layer. In an embodiment, core layer 503 represents one of patterned feature layers described above. In an embodiment, core layer 503 is deposited to the thickness from about 50 nm to about 200 nm. In more specific embodiment, the thickness of the core layer 503 is about 100 nm. In an embodiment, insulating layer 502 is an oxide deposited to increase adhesion between the amorphous silicon layer and the substrate. An etch stop layer 504 is deposited on core layer 503. In an embodiment, the etch stop layer 504 is a nitride film, for example a silicon nitride film, titanium nitride, or any other nitride film. In an embodiment, the etch stop layer is silicon oxide, silicon carbide, silicon nitride doped with carbon, silicon oxynitride, titanium oxide, aluminum oxide, other material layer that is different from the material of the underlying core layer 503, or other etch stop layer known to one of ordinary skill in the art of electronic device manufacturing. In an embodiment, the thickness of the etch stop layer 504 is from about 10 nm to about 30 nm. In more specific embodiment, the thickness of the etch stop layer 504 is about 20 nm. In an embodiment, etch stop layer 504 is deposited in a plasma chamber using an LPCVD technique. In an embodiment, etch stop layer 504 is deposited in a plasma chamber using a SACVD, PECVD, HDP-CVD, ALD, or other etch stop deposition technique known to one of ordinary skill in the art of electronic device manufacturing.

A hard mask layer 505 is deposited on etch stop layer 504. In an embodiment, hard mask layer 505 is an Advanced Patterning Film (APF) hard mask. In an embodiment, hard mask layer 505 is a silicon carbide, aluminum nitride, or other hard mask material layer that is selective to the underlying layers. In an embodiment, hard mask layer 505 is an amorphous carbon hard mask layer. In an embodiment, hard mask layer 505 is a boron doped amorphous carbon layer (BACL) manufactured by Applied Materials, Inc. located in Santa Clara, Calif., or other BACL.

In an embodiment, hard mask layer 505 is deposited in a plasma chamber using an LPCVD, SACVD, PECVD, HDP-CVD, ALD, or other hard mask deposition technique known to one of ordinary skill in the art of electronic device manufacturing. In an embodiment, the thickness of the hard mask layer 505 is from about 50 nm to about 200 nm. In more specific embodiment, the thickness of the hard mask layer 505 is about 100 nm.

An etch stop layer 506 is deposited on hard mask layer 505. In an embodiment, the etch stop layer 506 is a nitride film, for example a silicon nitride film, titanium nitride, or any other nitride film. In an embodiment, the etch stop layer is silicon oxide, silicon carbide, silicon nitride doped with carbon, silicon oxynitride, titanium oxide, aluminum oxide, other material layer that is different from the material of the underlying core layer 503, or other etch stop layer known to one of ordinary skill in the art of electronic device manufacturing. In an embodiment, the thickness of the etch stop layer 506 is from about 10 nm to about 30 nm. In more specific embodiment, the thickness of the etch stop layer 506 is about 20 nm. In an embodiment, etch stop layer 506 is deposited in a plasma chamber at a temperature lower than the temperature of depositing of the etch stop layer 504 to avoid damaging of the underlying layers. In an embodiment, etch stop layer 506 is deposited in a plasma chamber using a PECVD technique. In an embodiment, etch stop layer 506 is deposited in a plasma chamber using a SACVD, LPCVD, HDP-CVD, ALD, or other etch stop deposition technique known to one of ordinary skill in the art of electronic device manufacturing.

An antireflection coating layer 507 is deposited on etch stop layer 506. In an embodiment, antireflection coating layer 507 is a bottom anti-reflective coating (BARC) layer. In an embodiment, antireflection coating layer 507 is deposited using one of the antireflection coating deposition techniques known to one of ordinary skill in the art of electronic device manufacturing. In an embodiment, the thickness of the antireflection coating layer 507 is from about 1 nm to about 10 nm.

A photoresist layer 508 comprising a plurality of features, such as features 521 and 522 are deposited on antireflection coating layer 507. The photoresist layer is patterned and etched to form the plurality of features. In an embodiment, the photoresist layer 508 is patterned and etched using any of the photoresist patterning and etching techniques known to one of ordinary skill in the art of electronic device manufacturing. In an embodiment, the thickness of the photoresist layer 508 is from about 10 nm to about 100 nm.

Figure 5B:
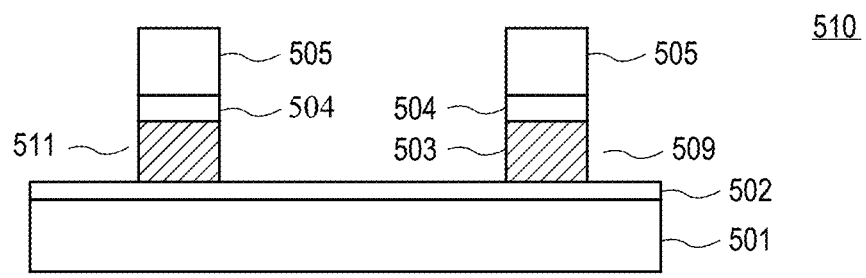
FIG. 5B is a view similar to FIG. 5A after stacks are formed on an insulating layer on a substrate according to one embodiment of the invention.

FIG. 5B is a view 500 similar to FIG. 5A after stacks 509 and 511 are formed on insulating layer 502 on substrate 501 according to one embodiment of the invention. As shown in FIGS. 5A and 5B, the patterned photoresist layer 508, antireflection coating layer 507, and etch stop layer 506 are removed. In an embodiment, the photoresist layer 508 is removed using one of the photoresist removing techniques known to one of ordinary skill in the art of electronic device manufacturing. In an embodiment, the antireflection coating layer 507 is removed using one of the antireflection coating removal techniques known to one of ordinary skill in the art of electronic device manufacturing. In an embodiment, the etch stop layer 506 is removed using one of the etch stop layer removal techniques known to one of ordinary skill in the art of electronic device manufacturing.

As shown in FIG. 5B, each of the stacks 511 and 509 comprises patterned hard mask layer 505 on etch stop layer 504 on core layer 503. The hard mask layer 505 on etch stop layer 504 are patterned and etched using one of patterning and etching techniques known to one of ordinary skill in the art of electronic device manufacturing. As shown in FIG. 5B, core layer 503 is etched through the patterned hard mask layer on etch stop layer 504 down to insulating layer 502. In an embodiment, core layer 503 is etched in a plasma chamber as depicted in FIGS. 8, 9, and 10, or any other plasma chamber using one of the plasma etching techniques known to one of ordinary skill in the art of electronic device manufacturing.

Figure 5C:
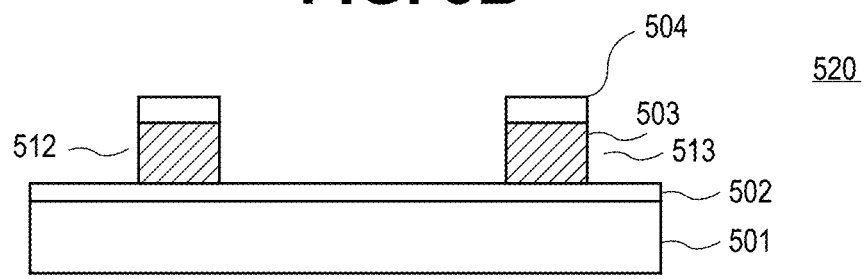
FIG. 5C is a view similar to FIG. 5B after the patterned hard mask layer is removed according to one embodiment of the invention.

FIG. 5C is a view 520 similar to FIG. 5B after the patterned hard mask layer 505 is removed according to one embodiment of the invention. As shown in FIG. 5C, a stack 512 and stack 513 are formed. Each of the stacks 512 and 513 comprises patterned etch stop layer 504 on core layer 503. In an embodiment, patterned hard mask layer 505 is removed by etching in a plasma chamber as depicted in FIGS. 8, 9, and 10, or any other plasma chamber using one of the plasma etching techniques known to one of ordinary skill in the art of electronic device manufacturing.

Figure 5D:
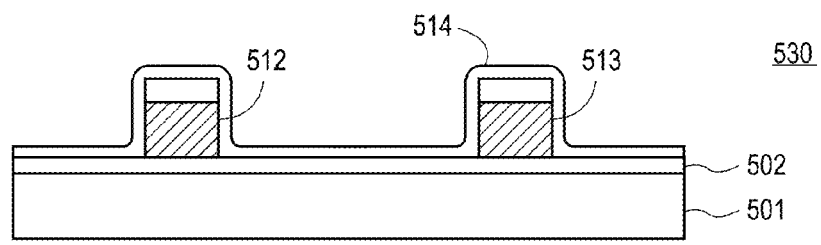
FIG. 5D is a view similar to FIG. 5C after a first cycle spacer layer is conformally deposited on stacks according to one embodiment of the invention.

FIG. 5D is a view 530 similar to FIG. 5C after a first cycle spacer layer 514 is conformally deposited on stacks 512 and 513 according to one embodiment of the invention. As shown in FIG. 5D, first cycle spacer layer 514 is deposited on top surfaces and sidewalls of each of the stacks 512 and 513, and on the portions of the insulating layer 502 exposed by the stacks 512 and 513. In an embodiment, the first cycle spacer layer 514 represents one of the first cycle spacer layers described above, for example, first cycle spacer layer 106.

Figure 5E:
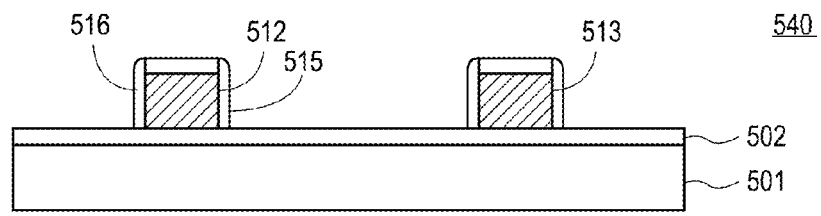
FIG. 5E is a view similar to FIG. 5D, after first cycle spacers are formed on sidewalls of the stacks according to one embodiment of the invention.

FIG. 5E is a view 540 similar to FIG. 5D, after first cycle spacers are formed on sidewalls of the stacks 512 and 513 according to one embodiment of the invention. As shown in FIG. 5E, the first cycle spacers, such as spacers 515 and 516 are formed on opposite sidewalls of the stacks. In an embodiment, each of the spacers 515 and 516 represents one of the spacers described above, e.g., spacer 107. As shown in FIG. 5E, the portions of the spacer layer 514 are removed from the top portions of the stacks 512 and 513 and from the exposed portions of the insulating layer 502. In an embodiment, the portions of the spacer layer 514 on the top portions of the stacks 512 and 513 and on the exposed portions of the insulating layer 502 are etched using plasma particles, as described above.

Figure 5F:
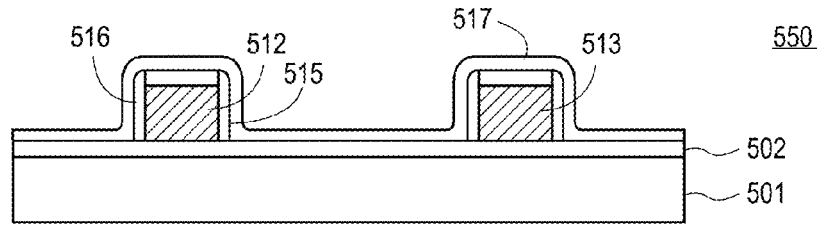
FIG. 5F is a view similar to FIG. 5E after a second cycle spacer layer is conformally deposited on the first cycle spacers according to one embodiment of the invention.

FIG. 5F is a view 550 similar to FIG. 5E after a second cycle spacer layer 517 is conformally deposited on the first cycle spacers according to one embodiment of the invention. As shown in FIG. 5F, the second cycle spacer layer 517 is deposited first cycle spacers, such as spacers 515 and 516, on the top portions of the stacks 512 and 513, and on the exposed portions of the insulating layer 502. In an embodiment, second cycle spacer layer 517 represents one of the spacer layers described above, such as spacer layer 109.

Figure 5G:
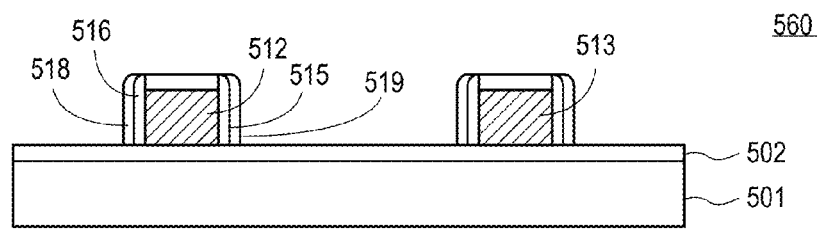
FIG. 5G is a view similar to FIG. 5F, after the second cycle spacer layer is etched to form second cycle spacers according to one embodiment of the invention.

FIG. 5G is a view 560 similar to FIG. 5F, after the second cycle spacer layer 517 is etched to form second cycle spacers according to one embodiment of the invention. As shown in FIG. 5G, the second cycle spacers, such as spacers 518 and 519 are formed on the first cycle spacers. In an embodiment, each of the spacers 518 and 519 represents one of the spacers described above, e.g., spacer 111. As shown in FIG. 5G, the portions of the second cycle spacer layer 517 are removed from the top portions of the stacks 512 and 513, and from the exposed portions of the insulating layer 502. In an embodiment, the portions of the spacer layer 517 on the top portions of the stacks 512 and 513 and on the exposed portions of the insulating layer 502 are etched using plasma particles, as described above.

Figure 5H:
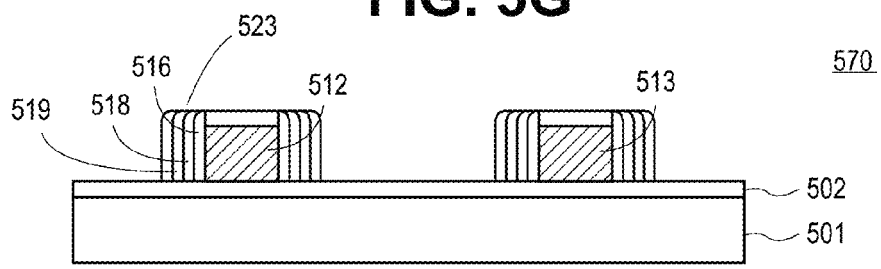
FIG. 5H is a view similar to FIG. 5G after multiple cycle spacers are formed on the sidewalls of the stacks according to one embodiment of the invention.

FIG. 5H is a view 570 similar to FIG. 5G after multiple cycle spacers are formed on the sidewalls of the stacks according to one embodiment of the invention. As shown in FIG. 5H, multiple cycle spacers, such as a multiple cycle spacer 523 are formed on the opposing sidewalls of the stacks 512 and 513. Each of the multiple cycle spacers comprises a plurality of spacer portions. As shown in FIG. 5H, multiple cycle spacer 523 comprises a third cycle spacer portion 519 on second cycle spacer portion 518 on first cycle spacer portion 516 on the sidewall of the stack 512.

In an embodiment, a cycle involving depositing and etching of the spacer layer as described above with respect to FIGS. 5E and 5F is repeated a number of times until a multiple cycle spacer having a predetermined thickness is formed, as described above. In an embodiment, the workpiece comprising multiple cycle spacers depicted in FIG. 5H is used for multiple patterning, as described above with respect to FIGS.

1F-1I, 2A-2J. In an embodiment, embodiments of the multiple cycle spacers as described herein are used for self aligned double patterning (SADP), self aligned triple patterning (SATP), self aligned quadruple patterning (SAQP), or other self aligned multiple patterning technique.

Figure 6:
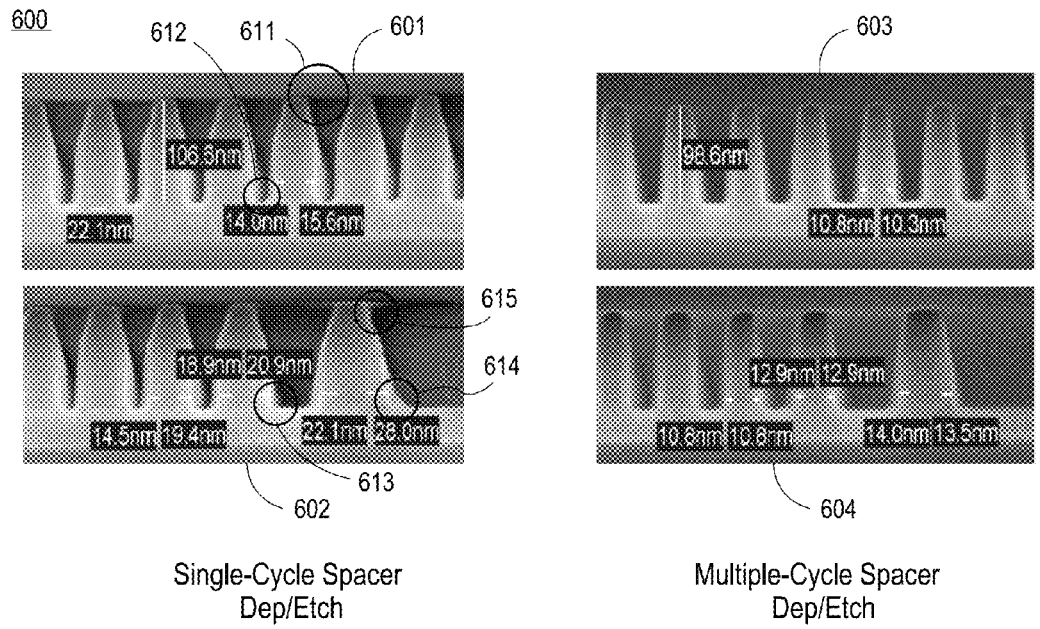
FIG. 6 is a view showing images of exemplary spacer deposition and etch according to one embodiment of the invention.

FIG. 6 is a view 600 showing images of exemplary spacer deposition and etch according to one embodiment of the invention. An image 601 illustrates a single cycle thick spacer formed on patterned features using a conventional technique in a dense pattern area of the design pattern. An image 602 illustrates a single cycle thick spacer formed on patterned features using a conventional technique in an open pattern area of the design pattern. As shown in images 601 and 602, the spacer formed using the conventional technique has a top shoulder recess 611 and a tapered bottom (footing) 612 in dense pattern area and a top shoulder recess 615, a footing 613 and footing 614 in the open pattern area. As shown in images 601 and 602, the width of the spacers formed in dense pattern area and open pattern area using the conventional technique is not uniform and varies from about 14 nm to about 28 nm due to pattern loading effect.

An image 603 illustrates a multiple cycle spacer formed on patterned features in a dense pattern area of the design pattern according to one embodiment of the invention. An image 604 illustrates a multiple cycle spacer formed on patterned features in an open pattern area of the design pattern according to one embodiment of the invention. Images 603 and 605 show multiple cycle spacers formed on the patterned features by breaking up the single cycle of the spacer deposition and etch into five separate cycles involving deposition and etch, where each of the deposition and etch cycles lasts about ⅕ of the single deposition and etch cycle. As shown in images 603 and 604, the multiple cycle spacers have substantially flat tops, and the sidewalls that are substantially perpendicular to the substrate so that the shoulder recess and footing are substantially eliminated. As shown in images 603 and 604, the width of the multiple cycle spacers deposited on the sidewalls of the patterned features in dense pattern area and open pattern area is uniform, so that the pattern loading effect is substantially eliminated.

Figure 7:
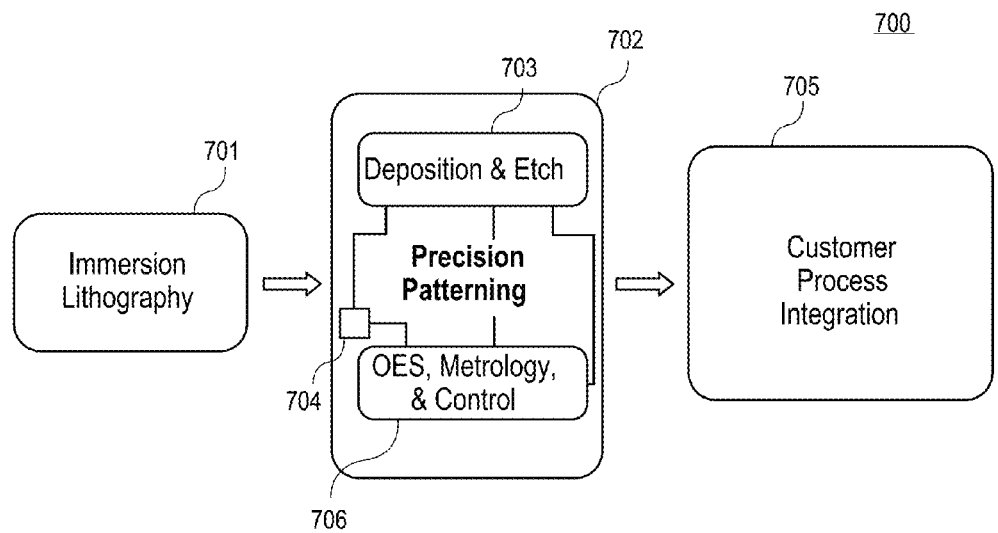
FIG. 7 shows a block diagram of a system to manufacture an electronic device according to one embodiment of the invention.

FIG. 7 shows a block diagram of a system 700 to manufacture an electronic device according to one embodiment of the invention. The system comprises an immersion lithography subsystem 701 to pattern features on a substrate as described above. In an embodiment, the immersion lithography subsystem 701 can pattern the features using a 193 nm wavelength, 248 nm wavelength, or other wavelength known to one of ordinary skill in the art. Immersion lithography subsystem 701 is coupled to a precision patterning subsystem 202. Precision patterning subsystem 202 comprises a deposition and etch tool 703 to perform deposition and etching of the multiple cycle spacer layers over the substrate, as described above. Precision patterning subsystem 702 comprises an optical emission spectroscopy (OES) diagnostics, metrology, and control tool 706 coupled to deposition and etch tool 703 to monitor and control deposition and etching parameters in a plasma chamber to form the multiple cycle spacers over the substrate, as described above. Precision patterning subsystem 702 comprises a processor 704 to control deposition and etch tool 703 and OES diagnostics, metrology, and control tool 706 form the multiple cycle spacer as described above. Precision patterning subsystem 702 is coupled to a customer process integration subsystem 705 to integrate the multiple cycle spacers as described herein into a customer process to manufacture an electronic device, e.g., transistors, memories, capacitors, resistors, optoelectronic devices, switches, and any other active and passive electronic devices. In an embodiment, system 700 provides the multiple cycle spacers as described herein to print the device features having the size less than 10 nm.

FIG. 8 shows a block diagram of one embodiment of a processing system 800 to perform one or more methods described herein. System 800 comprises a plurality of process sections, for example, process sections 801, 802 and 803. Each of the process sections comprises one or more plasma chambers. For example, a process section 801 comprises a plasma deposition chamber 806 and a plasma deposition chamber 807. Process section 802 comprises a plasma etch chamber 805 and a plasma etch chamber 804. System 800 has an outlet 813 connected to a vacuum pump system (not depicted) to evacuate air and other volatile products to provide vacuum. System 800 comprises a plurality of loaders 808 to supply one or more workpieces through an input interface 809 to a robot 811. Robot 811 has one or more arms, such as an arm 812 to supply one or more workpieces to the plasma chambers to form multiple cycle spacers under vacuum or atmospheric pressure as described above. In an embodiment, the system 800 is an ICP, CCP, or RPS plasma processing system. In an embodiment, the system 800 is one of high performance plasma processing systems, for example a Producer processing system, a Centura processing system, a Mesa processing system, a Capa processing system, or other plasma processing system manufactured by Applied Materials, Inc. located in Santa Clara, Calif., or other plasma processing system.

FIG. 9 shows a block diagram of one embodiment of a processing system 900 to perform one or more methods described herein. System 900 comprises a plurality of plasma chambers, such as plasma chambers 901, 902, 903 and 904. Each of the plasma chambers 901 and 903 is configured to perform a multiple cycle spacer deposition and etch as described above. System 900 has an outlet 908 connected to a vacuum pump system (not depicted) to provide vacuum. System 900 comprises loaders 907 to supply one or more workpieces through an input interface 906 to a robot 905. Robot 905 has one or more arms, such as an arm 905 to supply one or more workpieces to the plasma chambers to form multiple cycle spacers under vacuum or atmospheric pressure as described above. In an embodiment, the system 900 is an ICP, CCP, or RPS plasma processing system. In an embodiment, the system 800 is one of high performance plasma processing systems, for example a Producer processing system, a Centura processing system, a Mesa processing system, a Capa processing system, or other plasma processing system manufactured by Applied Materials, Inc. located in Santa Clara, Calif., or other plasma processing system.

FIG. 10 shows a block diagram of one embodiment of a plasma system 1000 to provide multiple cycle spacer deposition and etch according to one embodiment of the invention. As shown in FIG. 10, system 1000 has a processing chamber 1001. A movable pedestal 1002 to hold a workpiece 1003 is placed in processing chamber 1001. Pedestal 1002 comprises an electrostatic chuck ("ESC"), a DC electrode embedded into the ESC, and a cooling/heating base. In an embodiment, pedestal 1002 acts as a moving cathode. In an embodiment, the ESC comprises an $Al_2O_3$ material, $Y_2O_3$, or other ceramic materials known to one of ordinary skill of electronic device manufacturing. A DC power supply 1004 is connected to the DC electrode of the pedestal 102.

As shown in FIG. 10, a workpiece 1003 is loaded through an opening 1008 and placed on the pedestal 1002. The workpiece 1003 represents one of the workpieces described above. System 1000 comprises an inlet to input one or more process gases 1012 through a mass flow controller 1011 to a plasma source 1013. A plasma source 1013 comprising a showerhead 1014 is coupled to the processing chamber 1001 to receive one or more gases 1012 to generate plasma particles, as described above. Plasma source 1013 is coupled to a RF source power 1010. Plasma source 1013 through showerhead 1014 generates a plasma 1015 in processing chamber 101 from one or more process gases 111 using a high frequency electric field. Plasma 1015 comprises plasma particles, such as ions, electrons, radicals, or any combination thereof, as described above. In an embodiment, power source 1010 supplies power from about 100 W to about 3000 W at a frequency from about 13.56 MHz to about 162 MHz to generate plasma 1015.

A plasma bias power 1005 is coupled to the pedestal 1002 (e.g., cathode) via a RF match 1007 to energize the plasma. In an embodiment, the plasma bias power 1005 provides a bias power that is not greater than 1000 W at a frequency between about 2 MHz to 60 MHz, and in a particular embodiment at about 13 MHz. A plasma bias power 1006 may also be provided, for example to provide another bias power that is not greater than 1000 W at a frequency from about 2 MHz to about 60 MHz, and in a particular embodiment, at about 60 MHz. Plasma bias power 1006 and bias power 1005 are connected to RF match 1007 to provide a dual frequency bias power. In an embodiment, a total bias power applied to the pedestal 1002 is from about 10 W to about 3000 W.

As shown in FIG. 10, a pressure control system 1009 provides a pressure to processing chamber 1001. As shown in FIG. 10, chamber 1001 has one or more exhaust outlets 1016 to evacuate volatile products produced during processing in the chamber. In an embodiment, the plasma system 1000 is an ICP system. In an embodiment, the plasma system 100 is a CCP system.

A control system 1017 is coupled to the chamber 1001. The control system 1017 comprises a processor 1018, a temperature controller 1019 coupled to the processor 1018, a memory 1020 coupled to the processor 1018, and input/output devices 1021 coupled to the processor 1018 to form multiple cycle spacers as described herein.

The processor 1018 has a configuration to control forming of a first portion of a first multiple cycle spacer on a sidewall of the first patterned feature. The processor 1018 has a configuration to control depositing of a first spacer layer on the first portion using the first plasma particles. The processor 1018 has a configuration to control etching of the first spacer layer to form a second portion on the first portion of the first spacer using second plasma particles. The processor 1018 has a configuration to continuously repeat a cycle comprising the depositing and etching operations until the first multiple cycle spacer having a predetermined thickness is formed, as described above. The processor 1018 has a configuration to control removing of the first patterned feature from the first spacer on a device layer on the substrate. The processor has a configuration to control etching of the device layer using the first spacer as a mask. The processor 1018 has a configuration to control removing of the first spacer. The processor 1018 has a configuration to control removing the first patterned feature from the first spacer. The processor 1018 has a configuration to control depositing a second spacer layer on the first spacer using the first plasma particles. The processor 1018 has a configuration to control etching the second spacer layer using the second plasma particles to form a first portion of a second spacer. The processor 1018 has a configuration to control continuously repeating a cycle comprising the depositing and etching of the second spacer layer until the second spacer having a predetermined thickness is formed.

The processor 1018 has a configuration to control adjusting at least one of a pressure, a temperature, a time, bias power, source power, a first gas chemistry, a first gas flow, or any combination thereof, as described above. The control system 1017 is configured to perform methods as described herein and may be either software or hardware or a combination of both.

The plasma system 1000 may be any type of high performance semiconductor processing plasma systems known in the art, such as but not limited to an etcher, a cleaner, a furnace, or any other plasma system to manufacture electronic devices. In an embodiment, the system 1000 may represent one of the plasma systems e.g., Producer, Centura, Mesa or Capa plasma systems manufactured by Applied Materials, Inc. located in Santa Clara, Calif., or any other plasma system.

In the foregoing specification, embodiments of the invention have been described with reference to specific exemplary embodiments thereof. It will be evident that various modifications may be made thereto without departing from the broader spirit and scope of embodiments of the invention as set forth in the following claims. The specification and drawings are, accordingly, to be regarded in an illustrative sense rather than a restrictive sense.

What is claimed is:

1. A method to manufacture an electronic device comprising:
   forming a first portion of a multiple cycle spacer on a sidewall of a patterned feature over a substrate;
   depositing a spacer layer on the first portion using a first plasma process; and
   etching the spacer layer to form a second portion of the multiple cycle spacer on the first portion using a second plasma process, wherein a cycle comprising the depositing and etching of the spacer layer is continuously repeated until the multiple cycle spacer is formed, wherein the depositing and etching are performed using a single vacuum system.

2. The method of claim 1, wherein the patterned feature comprises a hard mask, a gate stack, or both, and the spacer layer is a nitride layer.

3. The method of claim 1, wherein the method further comprises
   removing the patterned feature from the multiple cycle spacer on a device layer on the substrate;
   etching the device layer using the multiple cycle spacer as a mask; and
   removing the multiple cycle spacer.

4. The method of claim 1, wherein the thickness of the spacer layer is from 5 nanometers (nm) to 10 nm.

5. The method of claim 1, wherein the depositing is performed using a sub-atmospheric chemical vapor deposition (SACVD) technique, a low pressure chemical vapor deposition (LPCVD) technique, a plasma enhanced chemical vapor deposition (PECVD) technique, a high density plasma chemical vapor deposition (HDP-CVD) technique, or an atomic layer deposition (ALD) technique.

6. A method to manufacture an electronic device comprising:
   forming a first portion of a multiple cycle spacer on a sidewall of a patterned feature over a substrate;
   depositing a spacer layer on the first portion using a first plasma process; and
   etching the spacer layer to form a second portion of the multiple cycle spacer on the first portion using a second plasma process, wherein a cycle comprising the depositing and etching of the spacer layer is continuously repeated until the multiple cycle spacer is formed, wherein the depositing and etching are performed using a single plasma chamber.

7. A method to provide a multiple cycle spacer to manufacture an electronic device, the method comprising
   depositing a first spacer layer on a first patterned feature over a substrate using a first plasma process;
   etching the first spacer layer to form a first portion of a first multiple cycle spacer on a sidewall of the patterned feature using a second plasma process;
   depositing a second spacer layer on the first portion using the first plasma process; and
   etching the second spacer layer using the second plasma process to form a second portion of the first multiple cycle spacer on the first portion, wherein the depositing and etching are performed in a single vacuum system.

8. The method of claim 7, wherein the first patterned feature comprises a hard mask, a gate stack, or both, and each of the first spacer layer and the second spacer layer is a nitride layer.

9. The method of claim 7, wherein the thickness of each of the first spacer layer and second spacer layer is from 5 nm to 10 nm.

10. The method of claim 7, wherein each of the depositing and etching comprises
    adjusting at least one of a pressure, a temperature, a time, bias power, source power, a first gas chemistry, a first gas flow, or any combination thereof.

11. A method to provide a multiple cycle spacer to manufacture an electronic device, the method comprising
    depositing a first spacer layer on a first patterned feature over a substrate using a first plasma process;
    etching the first spacer layer to form a first portion of a first multiple cycle spacer on a sidewall of the patterned feature using a second plasma process;
    depositing a second spacer layer on the first portion using the first plasma process;
    etching the second spacer layer using the second plasma process to form a second portion of the first multiple cycle spacer on the first portion;
    removing the first patterned feature from the first multiple cycle spacer;
    depositing a third spacer layer on the first multiple cycle spacer using the first plasma process; and
    etching the third spacer layer using the second plasma process to form a first portion of a second multiple cycle spacer, wherein a cycle comprising the depositing and etching of the third spacer layer is continuously repeated until the second multiple cycle spacer having a predetermined thickness is formed.

12. A method to provide a multiple cycle spacer to manufacture an electronic device, the method comprising
    depositing a first spacer layer on a first patterned feature over a substrate using a first plasma process;
    etching the first spacer layer to form a first portion of a first multiple cycle spacer on a sidewall of the patterned feature using a second plasma process;
    depositing a second spacer layer on the first portion using the first plasma process; and
    etching the second spacer layer using the second plasma process to form a second portion of the first multiple cycle spacer on the first portion, wherein the depositing and etching are performed in a single plasma chamber.

13. A system to manufacture an electronic device, comprising:
    a first processing chamber comprising a pedestal to hold a workpiece comprising a first patterned feature over a substrate;
    a plasma source coupled to the first processing chamber to generate first plasma particles at a first plasma process; and
    a processor coupled to the plasma source, the processor having a first configuration to control forming a first portion of a first multiple cycle spacer on a sidewall of the first patterned feature; the processor having a second configuration to control depositing a first spacer layer on the first portion using the first plasma process; the processor having a third configuration to control etching the first spacer layer to form a second portion of the first multiple cycle spacer on the first portion using a second plasma process, and the processor having a fourth configuration to continuously repeat a cycle comprising the depositing and etching of the first spacer layer until the first multiple cycle spacer is formed.

14. The system of claim 13, wherein the plasma source is further to generate second plasma particles at a second plasma process.

15. The system of claim 13, further comprising
    a second processing chamber coupled to the first processing chamber and a vacuum system coupled to the second processing chamber.

16. The system of claim 13, wherein the processor has a fifth configuration to control removing the first patterned feature from the first multiple cycle spacer on a device layer on the substrate; wherein the processor has a sixth configuration to control etching of the device layer using the first multiple cycle spacer as a mask; and wherein the processor has a seventh configuration to control removing the first multiple cycle spacer.

17. The system of claim 13, wherein the thickness of the first spacer layer is from 5 nanometers (nm) to 10 nm.

18. The system of claim 13, wherein the processor has an eighth configuration to control removing the first patterned feature from the first multiple cycle spacer; wherein the processor has a ninth configuration to control depositing a second spacer layer on the first multiple cycle spacer using the first plasma process; and wherein the processor has a tenth configuration to control etching the second spacer layer using the second plasma process to form a first portion of a second multiple cycle spacer, wherein the processor has an eleventh configuration to control continuously repeating a cycle comprising the depositing and etching of the second spacer layer until the second multiple cycle spacer is formed.

19. The system of claim 13, wherein the processor has a twelfth configuration to control adjusting at least one of a pressure, a temperature, a time, bias power, source power, a first gas chemistry, a first gas flow, or any combination thereof.

* * * * *